US006832071B1

(12) United States Patent
Nakamura et al.

(10) Patent No.: US 6,832,071 B1
(45) Date of Patent: Dec. 14, 2004

(54) SATELLITE BROADCAST RECEPTION SYSTEM CAPABLE OF CONNECTION WITH PLURALITY OF SATELLITE RECEIVERS

(75) Inventors: Makio Nakamura, Osaka (JP); Hiroshi Atarashi, Kashihara (JP); Takao Imai, Takaichi-gun (JP); Tetsuhide Okahashi, Kashihara (JP); Masanori Wakiyama, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 748 days.

(21) Appl. No.: 09/664,562

(22) Filed: Sep. 18, 2000

(30) Foreign Application Priority Data

| Oct. 1, 1999 | (JP) | ............................................. | 11-281393 |
| Aug. 25, 2000 | (JP) | ........................................ | 2000-255634 |

(51) Int. Cl.$^7$ .............................................. H04H 1/100
(52) U.S. Cl. ...................... 455/3.02; 455/430; 455/428; 455/13.3; 342/362; 370/326
(58) Field of Search ............................... 455/3.02, 3.03, 455/3.04, 428, 430, 13.3; 370/326; 725/68, 69, 71; 342/361, 362, 364, 365, 366

(56) References Cited

U.S. PATENT DOCUMENTS

| 5,940,737 | A |  | 8/1999 | Eastman |  |
| 6,487,391 | B1 | * | 11/2002 | Park | ........................... 455/3.02 |
| 6,487,620 | B1 | * | 11/2002 | Grosshog et al. | ........... 710/107 |
| 6,507,952 | B1 | * | 1/2003 | Miller et al. | ................... 725/76 |
| 6,549,754 | B1 | * | 4/2003 | Miller et al. | ............... 455/3.02 |
| 6,600,730 | B1 | * | 7/2003 | Davis et al. | ................ 370/343 |

FOREIGN PATENT DOCUMENTS

| DE | 299 08 092 | 9/1999 |
| EP | 0 851 574 | 7/1988 |
| JP | 62-171337 | 7/1987 |
| JP | 8-116208 | 5/1996 |
| JP | 8-293720 | 11/1996 |
| JP | 9-270973 | 10/1997 |
| JP | 10-135731 | 5/1998 |
| JP | 10-210458 | 8/1998 |
| JP | 11-8847 | 1/1999 |

* cited by examiner

*Primary Examiner*—Nick Corsaro
(74) *Attorney, Agent, or Firm*—Nixon & Vanderhye P.C.

(57) ABSTRACT

An LNB (low noise block down converter) that can have a plurality of receivers connected includes a conversion unit receiving a plurality of types of polarized wave signals transmitted from each of a plurality of satellites to convert the plurality of polarized wave signals into a plurality of intermediate frequency signals, an amplify switch connected to the conversion unit to receive the plurality of intermediate frequency signals as inputs, and having a plurality of outputs connected to a plurality of output ports, respectively, determining a status according to a select signal and providing an amplified intermediate frequency signal, and a first control unit receiving digital serial data to select a satellite from an external source via an output port and providing a select signal according to the digital serial data.

30 Claims, 17 Drawing Sheets

SATELLITE BROADCAST RECEPTION SYSTEM CAPABLE OF CONNECTION WITH PLURALITY OF SATELLITE RECEIVERS

BACKGROUND OF THE INVENTION

1. Field of the Invention

The present invention relates to a satellite broadcast reception system. More particularly, the present invention relates to a satellite broadcast reception system that can receive individually with a plurality of satellite receivers a plurality of satellite broadcasting signals received from a plurality of satellites.

2. Description of the Background Art

Referring to FIG. 8, communication satellites (CS) called JCSAT3 and JCSAT4 are launched at 128° and 124° of east longitude up in the sky over Japan. The satellite broadcasting signal transmitted by respective satellites are formed of the two types of signals of a horizontally polarized wave and a vertically polarized wave. The antenna for receiving a satellite broadcast that can receive satellite broadcasting signals transmitted from the two satellites includes a reflector dish 6 reflecting the satellite broadcasting signal transmitted by the two satellites, and an LNB (Low Noise Block Down Converter) 58 that amplifies the low noise of a satellite broadcasting signal reflected at reflector dish 6 and converts the frequency down to a low frequency band. A receiver of a satellite broadcasting signal such as a television receiver 60 is connected to LNB 58.

Referring to FIG. 9, a conventional LNB 58 includes an LNA (Low Noise Amplifier) 62 receiving horizontally and vertically polarized wave signals transmitted from JCSAT3 and horizontally and vertically polarized wave signals transmitted from JCSAT4 to amplify the low noise of either signal according to an output of a power supply circuit 68 that will be described afterwards, a BPF (Band Pass Filter) 64 connected to LNA 62 to receive the output of LNA 62 as an input, a local oscillator 26 generating a local oscillator signal of 11.2 GHz, a mixer 30A connected to BPF 64 and local oscillator 26 to mix the local oscillator signal with the signal output from BPF 64 to provide an IF (Intermediate Frequency) signal, an IF amplifier 66 connected to the output of mixer 30A to amplify an IF signal, and a capacitor 35A connected to the output of IF amplifier 66 to cut the noise of low frequency. Capacitor 35A is connected to the output terminal of an IF signal. The IF signal output terminal has the foregoing receiver connected to the end.

LNB 58 further includes a power supply circuit 68 connected to the IF signal output terminal to receive direct current DC from the IF signal output terminal and a low frequency pulse signal AC of an alternating current of several ten KHz overlying direct current DC to supply desired power to a semiconductor amplify element forming LNA 62 according to the voltage value of direct current DC and the presence of low frequency pulse signal AC. Power supply circuit 68 also supplies power to each component forming LNB 58 besides LNA 62.

LNA 62 includes semiconductor amplify elements 63A and 63B receiving the horizontally polarized wave signal and vertically polarized wave signal transmitted from JCSAT3 as respective inputs, semiconductor amplify elements 63C and 63D receiving the horizontally polarized wave signal and vertically polarized wave signal from JCSAT4 as inputs, respectively, and a semiconductor amplify element 63E connected to the outputs of semiconductor amplify elements 63A–63D.

The voltage value of direct current DC supplied from the IF signal output terminal includes the two types of 18 V and 13 V. When the voltage value of direct current DC is 18 V, a horizontally polarized wave signal is selected. When the voltage value of direct current DC is 13 V, a vertically polarized wave signal is selected. In the case direct current DC is overlaid over low frequency pulse signal AC, JCSAT3 is selected. When direct current DC is not overlaid over low frequency pulse signal AC, JCSAT4 is selected.

For example, in the case where direct current DC of 13 V overlaid with low frequency pulse signal AC is supplied to power supply circuit 68 from a receiver connected to the IF signal output terminal, the receiver selects the vertically polarized wave signal transmitted from JCSAT3. Therefore, power supply circuit 68 supplies power to semiconductor amplify elements 63B and 63E forming LNA 62. Power is not supplied to semiconductor amplify elements 63A, 63C and 63D. Thus, the vertically polarized wave signal transmitted from JCSAT3 has the low noise amplified by semiconductor amplify elements 63B and 63E. The low-noise amplified signal is applied to BPF 64 to have the image signal removed. Mixer 30A mixes the local oscillator signal generated at local oscillator 63 with the signal output from BPF 64 to provide an IF signal. IF amplifier 66 amplifies the IF signal. The amplified IF signal has the noise of the low frequency cut at capacitor 35A, and then output from the IF signal output terminal.

Accordingly, one of the two satellites is selected, and one of the two types of polarized wave signals transmitted from the selected satellite is selected. The selected polarized wave signal has the low noise amplified and frequency converted to be output from the IF signal output terminal.

LNB 58 has only one IF signal output terminal. Therefore, the signal output from LNB 58 is limited to one polarized wave signal transmitted from one satellite. This means that only one receiver can be connected to one LNB 58. A plurality of television receivers or video recorders cannot be connected thereto.

The satellite is selected based on the presence of low frequency pulse signal AC. Therefore, one LNB 58 can only receive the satellite broadcasting signals from two satellites. It was difficult to receive satellite broadcasting signals from three or more satellites.

If a satellite can be selected by digital serial data instead of the presence of a low frequency pulse signal AC, information of what type of polarized wave signal from which satellite has been selected can be processed by providing an apparatus that can process digital data such as a personal computer at the receiver side.

SUMMARY OF THE INVENTION

In view of the foregoing, an object of the present invention is to provide a satellite broadcast reception system that can have a plurality of receivers connected.

Another object of the present invention is to provide a satellite broadcast reception system that can receive a satellite broadcasting signal from at least three satellites.

A further object of the present invention is to provide a satellite broadcast reception system that can process information related to selection of a satellite and a polarized wave signal.

A low noise block down converter according to an aspect of the present invention includes a conversion unit receiving a plurality of types of polarized wave signals transmitted from each of a plurality of satellites to convert a plurality of polarized wave signals into a plurality of intermediate frequency signals, an amplify switch connected to the conversion unit with a plurality of intermediate frequency signals as inputs, and having a plurality of outputs connected to a plurality of output ports, respectively to determine a status according to a select signal and providing an amplified intermediate frequency signal, and a first control unit receiving external digital serial data to select a satellite via an output port and providing a select signaled according to the digital serial data.

The plurality of types of polarized wave signals transmitted from respective plurality of satellites are converted into intermediate frequency signals and then applied to the amplify switch. The first control unit receives external digital serial data via the plurality of output ports to apply a select signal to the amplify switch. The amplify switch receives a select signal for each output to provide a polarized wave signal according to the select signal. Therefore, a plurality of polarized wave signals are output from one low noise block down converter. The plurality of polarized wave signals can be selected independently by an external source through the plurality of output ports. Therefore, a plurality of satellite receivers can be connected to one low noise block down converter. Each of the plurality of satellite receivers can select a polarized wave signal independently. It is not necessary to install a low noise block down converter for each satellite differing in the orbit position.

Preferably, the converter unit includes a plurality of low noise amplifiers provided corresponding to each of the plurality of satellites, each low noise amplifier receiving a plurality of types of polarized wave signals to amplify low noise, a plurality of filters connected to the plurality of low noise amplifiers to remove an image signal from the low-noise amplified plurality of types of polarized wave signals, a local oscillator generating a local oscillator signal, a plurality of buffer amplifiers provided corresponding to each of the plurality of satellites, connected to the local oscillator to amplify a local oscillator signal, and a plurality of mixers provided corresponding to each of the plurality of satellites, and connected to a filter and a buffer amplifier corresponding to the satellite to mix the local oscillator signal with the plurality of types of polarized wave signals removed in image signals to output an intermediate frequency signal.

A buffer amplifier is connected between the local oscillator and the mixer in each satellite. Therefore, leakage of an RF (Radio Frequency) signal of a satellite to the RF signal of another satellite can be suppressed. The isolation of the RF signals between different satellites can be improved.

Further preferably, the amplify switch includes a switch having a plurality of outputs, connected to the conversion unit with a plurality of intermediate frequency signals as the inputs to define a status according to a select signal, and an amplifier unit connected to the switch, having a plurality of outputs connected to the plurality of output ports, respectively, to amplify respective plurality of outputs of the switch.

Following selection of an intermediate frequency signal by the switch, the selected signal is amplified. Therefore, the number of components forming the amplifier unit can be reduced than the case where the intermediate frequency signal is amplified at a preceding stage of the switch.

Further preferably, the amplifier unit includes a plurality of amplifiers connected to the plurality of outputs of the switch, respectively, to amplify the plurality of outputs, and a plurality of constant voltage regulators receiving power from an external source via a plurality of output ports to supply the power to the plurality of amplifiers.

A constant voltage regulator is provided for each amplifier. In the case where power is not supplied from the output port, the amplifier connecting to that output port is not supplied with power. Therefore, the power consumption of the low noise block down converter can be reduced.

Further preferably, the first control unit includes a second control unit receiving from an external source through the output port digital data to select a satellite and a direct current having a voltage value corresponding to the type of the polarized wave signal to output a select signal according to the digital serial data and the voltage value of the direct current.

A polarized wave signal can be selected according to the direct current having a predetermined voltage value. Thus, compatibility with a conventional satellite receiver can be maintained.

Further preferably, the low noise block down converter includes a power switch connected to a plurality of output ports to select any of the output ports according to a control signal for connection with the output, and a constant voltage power supply circuit connected to the power switch, receiving direct current output from the power switch to supply to the conversion unit and the second control unit power subjected to constant voltage conversion. The second control unit includes a select signal output unit providing a select signal according to digital serial data and the voltage value of the direct current, and a control signal output unit providing a control signal according to the digital serial data and the voltage value of the direct current.

The control signal output unit provides a control signal according to digital serial data and the voltage value of the direct current. The power switch selects any of the plurality of output ports according to the control signal. Digital serial data and direct current are supplied to the constant voltage power supply circuit from a satellite receiver through the selected output port. Digital serial data and constant current are not supplied from the other output ports. Therefore, even in the case where the voltage of the selected satellite receiver changes, that voltage change will not affect the digital serial data and the like transmitted from other satellite broadcast receiver. As a result, voltage drop will not occur at the output port connected to another satellite receiver. Also, false digital serial data caused by voltage drop will not occur. Therefore, the low noise block down converter can be operated stably without erroneous operation.

A satellite broadcast receiver according to another aspect of the present invention is input with an intermediate frequency signal according to a wave from a satellite through an input port. The satellite broadcast receiver includes an intermediate frequency signal conversion unit deriving and providing a video signal and an audio signal by the intermediate frequency signal input to the input port, an input unit through which a select signal to select a satellite is input, and a digital serial data supply unit connected to the input unit to supply digital serial data to select a satellite to the input port according to a select signal.

A satellite is selected by the digital serial data. By setting the number of bits of the digital serial data used in the selection of a satellite to at least 2 bits, a satellite broadcasting signal can be received from at least three satellites.

Preferably, the intermediate frequency signal conversion unit includes a video•audio signal extraction unit extracting and providing a video signal and audio signal from an intermediate frequency signal, and a reception signal information output unit providing reception signal information representing a reception status of a satellite from the intermediate frequency signal. The satellite broadcast receiver further includes a status signal output unit connected to the input unit and the reception signal information output unit to output a select signal and reception signal information.

A select signal and reception signal information are output from the status signal output unit. By connecting a personal computer to a satellite receiver, or by incorporating a personal computer in a satellite broadcast receiver, the status of the satellite, the reception status, and the like can be supervised according to a computer program. Therefore, past record information such as how long a viewer has watched a certain program can be obtained. When the viewer is not watching a program, the computer program can be downloaded from a satellite. Therefore, the maintenance and service of the system of the personal computer can be improved.

According to a further aspect of the present invention, a satellite broadcast reception system includes the above-described low noise block down converter, and a satellite receiver connected to the low noise block down converter for usage.

A plurality of types of polarized wave signals transmitted from respective plurality of satellites are converted into intermediate frequency signals and then applied to an amplify switch. A first control unit receives external digital serial data through a plurality of output ports and applies a select signal to the amplify switch. The amplify switch receives a select signal for each output to output a polarized wave signal according to the select signal. Therefore, a plurality of polarized wave signals are output from one low noise block down converter. The plurality of polarized wave signals can be selected independently by an external source through the plurality of output ports. Therefore, a plurality of satellite receivers can be connected to one low noise block down converter. The plurality of satellite receivers can select a polarized wave signal independently. It is not necessary to install a low noise block down converter individually for each satellite differing in orbit position.

Preferably, the satellite broadcast system includes the above-described satellite receiver.

A satellite is selected by digital serial data. By setting the number of bits of the digital serial data used in selecting a satellite to at least 2 bits, satellite broadcasting signals from at least three satellites can be received.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

At present, digital broadcast satellites (DBS) are launched at 101°, 110° and 119° of west longitude high up in the sky of the United States of America. EchoStar (registered trademark of Echostar Communications Corporation of US) which is one service provider of the American DBS broadcasts has obtained the broadcasting right associated with the satellites of 110° and 119° of west longitude.

Figure 1:
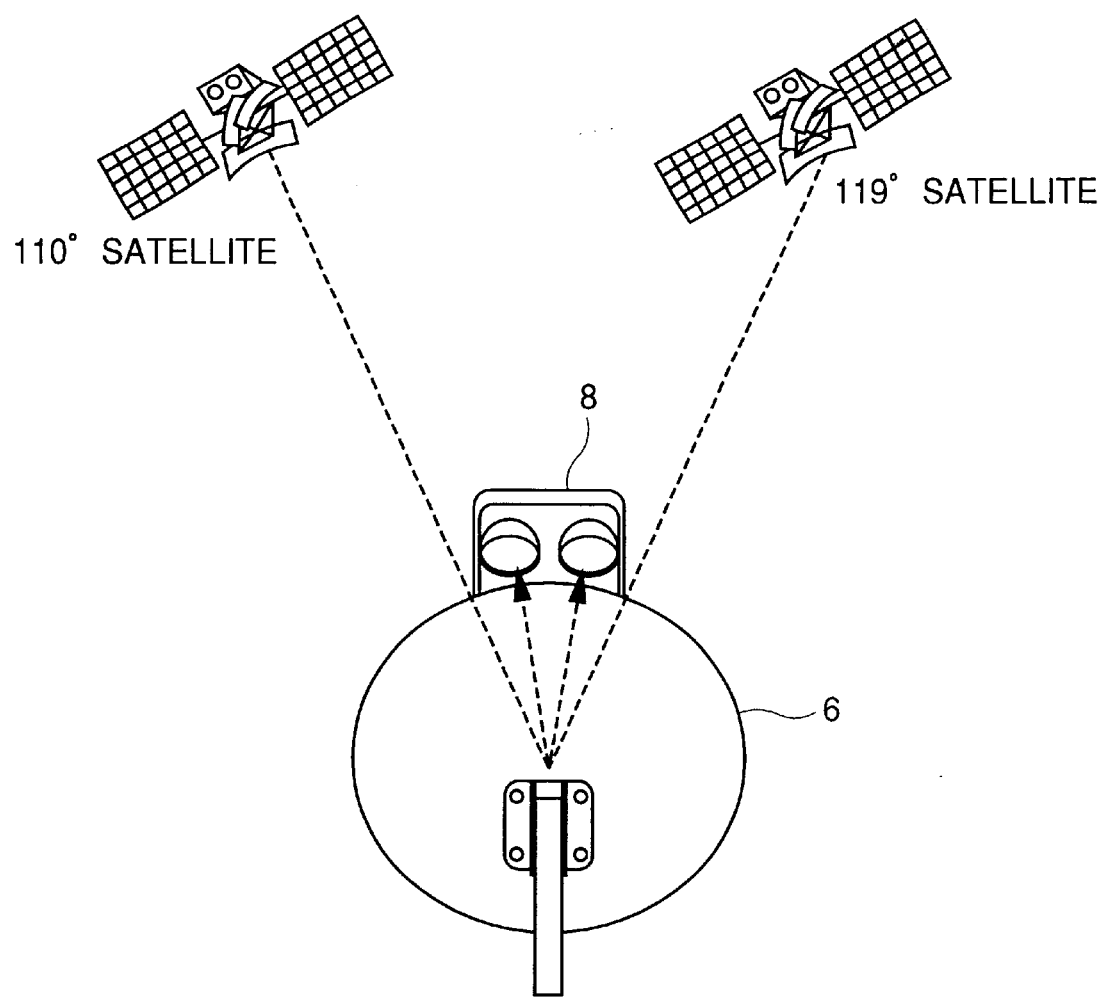
FIGS. 1 and 2 are diagrams to describe a structure of a satellite broadcast reception system according to a first embodiment of the present invention.
Figure 2:
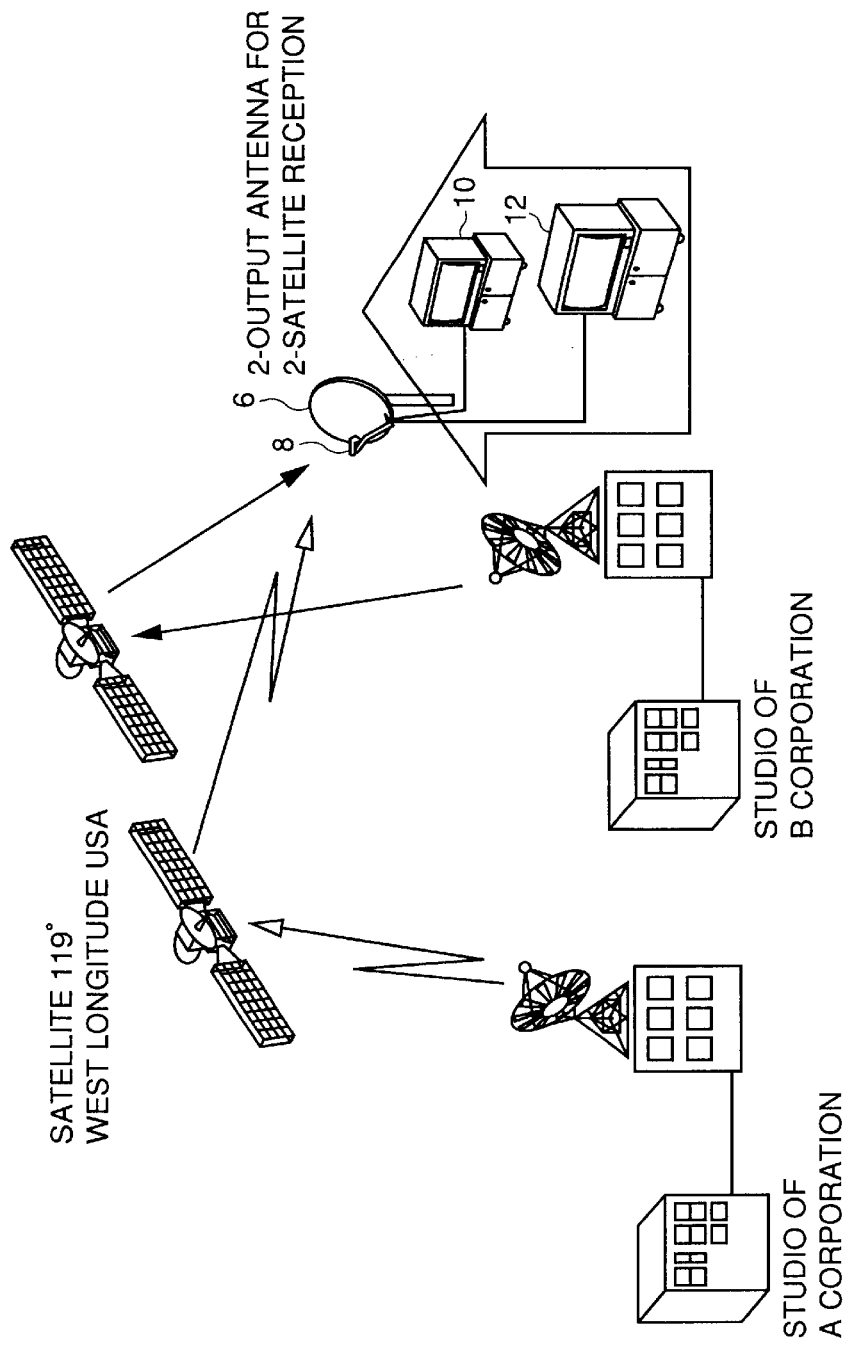

Referring to FIGS. 1 and 2, a satellite receiving antenna that can receive a satellite broadcasting signal transmitted from two satellites according to a first embodiment of the present invention includes a reflector dish 6 reflecting a satellite broadcasting signal transmitted from the two satellites, and an LNB 8 amplifying low noise of the satellite broadcasting signal reflected at reflector dish 6 and simultaneously converting the frequency to a low frequency band. LNB 8 is connected to two receivers of a satellite broadcasting signal such as television receivers 10 and 12.

Figure 3:
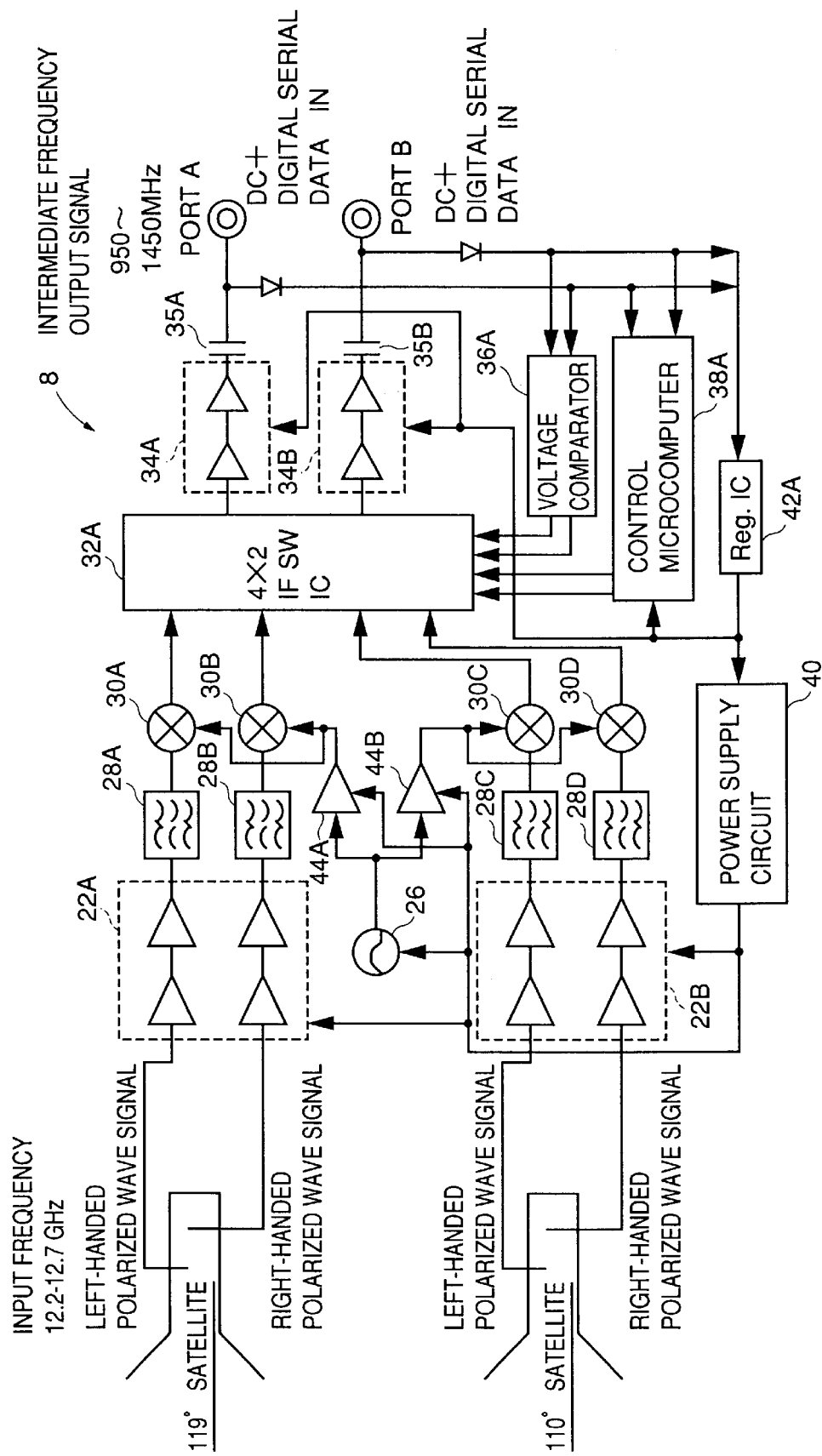
FIG. 3 shows a structure of an LNB according to the first embodiment of the present invention.

Referring to FIG. 3, LNB 8 includes an LNA22A receiving a left-handed polarized wave signal and a right-handed polarized wave signal transmitted from a satellite located at 119° of west longitude (referred to as "119° satellite" hereinafter) and amplifying low noise of respective polarized wave signals, an LNA 22B receiving a left-handed polarized wave signal and a right-handed polarized wave signal transmitted from the satellite located at 110° of west longitude (referred to as "110° satellite" hereinafter) to amplify low noise of respective polarized wave signals, BPF 28A and 28B connected to LNA 22A to remove image signals from respective left-handed and right-handed polarized wave signals amplified in low noise, BPF 28C and 28D connected to LNA 22B to remove respective image signals from left-handed and right-handed polarized wave signals amplified in low noise, a local oscillator 26 generating a sine wave signal (local oscillator signal) of 11.25 GHz, and buffer amplifiers 44A and 44B connected to local oscillator 26.

LNB 8 further includes a mixer 30A connected to BPF 28A and buffer amplifier 44A to mix the outputs of BPF 28A and buffer amplifiers 44A to output an IF signal, a mixer 30B connected to BPF 28B and buffer amplifier 44A to mix outputs of BPF 28B and buffer amplifier 44A to output an IF signal, a mixer 30C connected to BPF 28C and buffer amplifier 44B to mix the outputs of BPF 28C and buffer amplifier 44B to output an IF signal, and a mixer 30D connected to BPF 28D and buffer amplifier 44B to mix outputs of BPF 28D and buffer amplifier 44B to output an IF signal.

LNB 8 further includes a 4×2 IF switch IC (Integrated Circuit) 32A connected to mixers 30A–30D to select an IF signal output from mixers 30A–30D according to outputs of a control microcomputer 38A and a voltage comparator 36A to provide the selected IF signal from two output ports, IF amplifiers 34A and 34B connected to the two output ports of 4×2 IF switch IC 32A, and capacitors 35A and 35B connected to the outputs of IF amplifiers 34A and 34B, respectively, to cut the noise of low frequency.

Capacitors 35A and 35B are connected to output ports A and B of respective IF signals. The ends of output ports A and B are connected to a receiver. Details of a receiver will be described afterwards.

The IF signals output from the two output ports of 4×2 IF switch IC 32A may be IF signals of the same type or of a different type.

The receiver connected to output ports A and B supply digital serial data of 8 bits to LNB 8, and then supplies direct current DC after supply of the digital serial data. The digital serial data is formed of 8 bits. The first bit is the start bit indicating the beginning of digital serial data. The second to fourth bits are the error detection/correction code of the 8-bit data. The fifth to eighth bits are code called "switch bit" to select a satellite. One bit of the serial data is indicated with a voltage value of 8 msec in length. 0 and 1 are indicated when the voltage value is 13 V and 18 V, respectively. The voltage values of direct current DC correspond to the two types of 13 V and 18 V. When 13 V, a right-handed polarized wave signal is selected. When 18 V, a left-handed polarized wave signal is selected.

LNB 8 further includes a control microcomputer 38A connected to output ports A and B to receive digital serial data from the receiver connected to respective output ports to apply the select signal of a satellite to 4×2 IF switch IC 32A according to the switch bit of the digital serial data, a voltage comparator 36A connected to output ports A and B to receive direct current DC from respective output ports and comparing with a predetermined threshold value to apply a select signal of a polarized wave signal to 4×2 IF switch IC 32A, a constant voltage regulator 42A connected to output ports A and B to regulate the voltage value and supplying power of a constant voltage level to IF amplifiers 34A and 34B, control microcomputer 38A and a power supply circuit 40 that will be described afterwards, and a power supply circuit 40 connected to constant voltage regulator 42A to convert the power supplied from constant voltage regulator 42A into a desired voltage current and supplying the converted current to LNA 22A and 22B, buffer amplifiers 44A and 44B, and local oscillator 26, and the like.

A set top box 80 will be described as an example of a receiver with reference to FIG. 4. Set top box 80 includes a tuner unit 70 connected to one output port of LNB 8 via an input port 71 to receive an IF signal through the output port and converting the IF signal into a digital signal, a digital signal processing unit 76 connected to tuner unit 70 to process the received digital signal to output a video signal, an audio signal, and information related to the reception status or the like (referred to as "reception signal information" hereinafter), an input unit 82 through which a select signal is input to select a broadcasting satellite and a channel, a control unit 78 connected to digital signal processing unit 76, input unit 80, and an external apparatus such as a television receiver or a personal computer to output command data to select a satellite and a polarized wave signal according to a select signal received from input unit 82 or the external apparatus, and also to supply a select signal or digital signal (status signal) such as reception signal information to an external apparatus, a power supply unit 74, and a digital serial signal generation unit 72 connected to control unit 78 and power supply unit 74 to cause output of 8-bit digital serial data and direct current DC from power supply unit 74 according to the command data output from control unit 78. The digital serial signal and direct current DC output from power supply unit 74 is overlaid with the coaxial cable connected to the output port of the LNB via output port 71 to be transmitted to LNB 8.

The operation of LNB 8 and set top box 80 will be described with reference to FIGS. 3 and 4.

Figure 4:
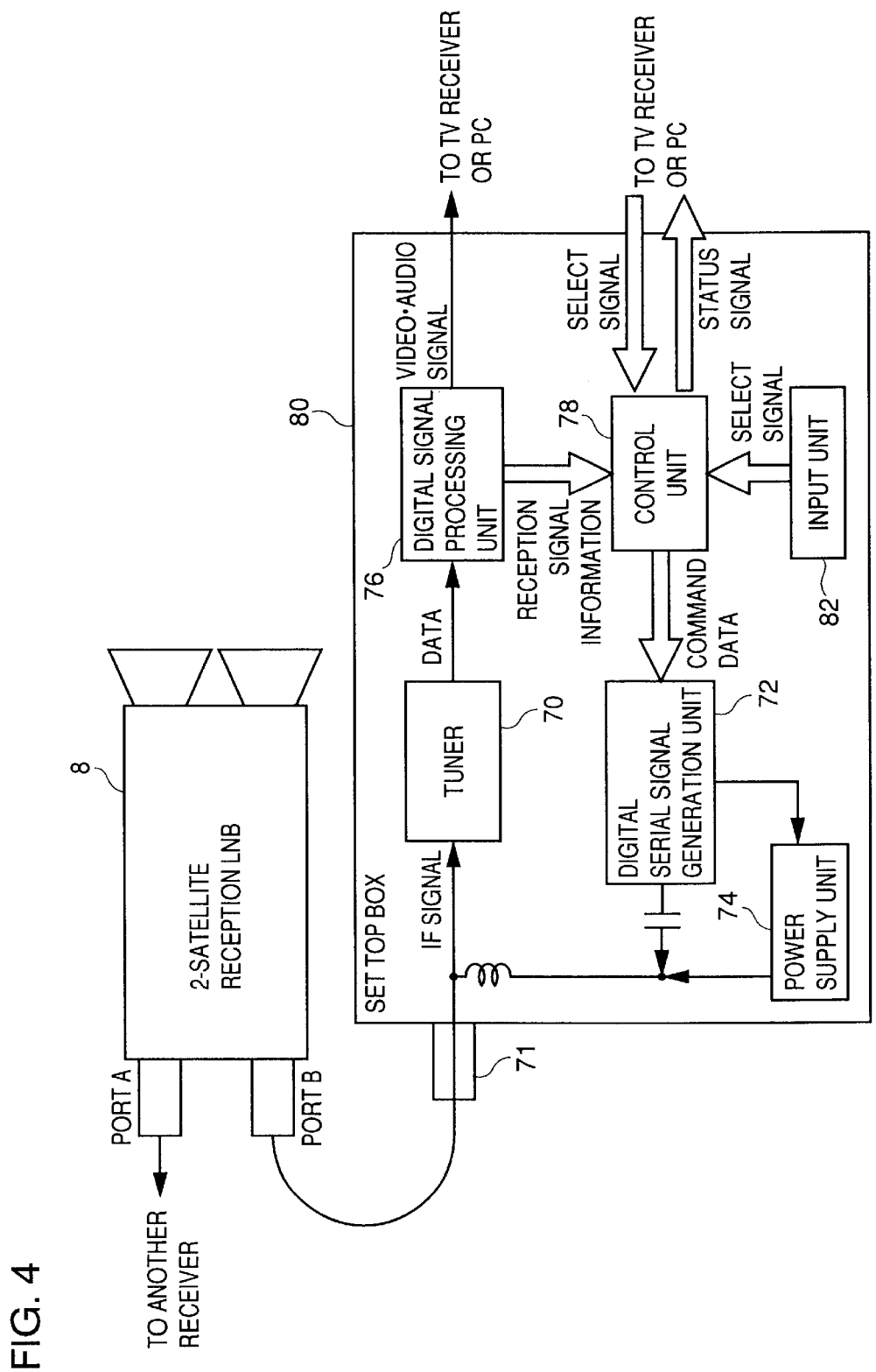
FIG. 4 shows a structure of a set top box according to the first embodiment of the present invention.

In FIG. 4, it is assumed that a select signal requesting a satellite broadcasting signal of channel 3 of 119° satellite is input from input unit 82 of set top box 80. It is assumed that the satellite broadcasting signal of an odd-numbered channel is overlaid on a right-handed polarized wave signal. Control unit 78 outputs command data to select a right-handed polarized wave signal of the 119° satellite. Digital serial signal generation unit 72 receives command data to drive power supply unit 74 according to the command data to output digital serial data and direct current DC.

Referring to FIG. 3 again, digital serial data and direct current DC are supplied to LNB 8 from output port B. The left-handed polarized wave signal and right-handed polarized wave signal transmitted from the 119° satellite are amplified in low noise by LNA 22A. The left-handed and right-handed polarized wave signals transmitted from the 110° satellite are amplified in low noise by LNA 22B. The left-handed and right-handed polarized wave signals amplified in low noise by LNA 22A are filter-processed by BPF 28A and 28B, respectively, to have the image signal removed. The left-handed and right-handed polarized wave signals amplified in low noise by LNA 22B are filter-processed by BPF 28C and 28D, respectively, to have the image signal removed.

The local oscillator signal generated at local oscillator 26 is amplified by buffer amplifiers 44A and 44B. Mixer 30A mixes the outputs of BPF 28A and buffer amplifier 44A to supply an IF signal to 4×2 IF switch IC 32A. Mixer 30B mixes the outputs of BPF 28B and buffer amplifier 44A to supply an IF signal to 4×2 IF switch IC 32A. Mixer 30C mixes the outputs of BPF 28C and buffer amplifier 40B to supply an IF signal to 4×2 IF switch IC 32A. Mixer 30D mixes the outputs of BPF 28D and buffer amplifier 44B to supply an IF signal to 4×2 IF switch IC 32A.

Control microcomputer 38A receives respective digital serial data from the receivers connected to output ports A and B. Set top box 80 is connected to output port B. Control microcomputer 38A receives the digital serial data to select the 119° satellite. Therefore, control microcomputer 38A supplies to 4×2 IF switch IC 32A a select signal to output a satellite broadcasting signal transmitted from the 119° satellite through the output port of 4×2 IF switch IC 32A connected to output port B according to the serial data received at output port B.

Voltage comparator 36A receives direct current DC from the receivers connected to output ports A and B. Set top box 80 is connected to output port B. Voltage comparator 36A compares the voltage of the direct current DC supplied from output port B with a predetermined threshold value and supplies to 4×2 IF switch IC 32A a select signal to output a right-handed polarized wave signal from the output port connected to output port B. Thus, a right-handed polarized wave signal of the 119° satellite is output from 4×2 IF switch IC 32A and amplified by IF amplifier 34B to be output from output port B.

Referring to FIG. 4 again, tuner unit 70 connected to output port B via input port 71 receives an IF signal and converts the IF signal into a digital signal. Digital signal processing unit 76 extracts a video signal, an audio signal and reception signal information from the digital signal converted at tuner unit 70, and supplies the video signal and the audio signal to an external apparatus and the reception signal information to control unit 78. Control unit 78 provides to an external apparatus information such as the satellite name and channel of the currently received satellite broadcasting signal as a status signal according to the reception signal information received from digital signal processing unit 76 and the select signal input through input unit 82.

In the case where a personal computer is employed as an external apparatus, the video signal and the audio signal can be reproduced on the personal computer. Also, selection of a satellite and a polarized wave signal, the reception status and the like can be supervised according to a computer program based on the select signal and the status signal. Therefore, past record information such as how long the viewer has watched which program can be obtained. Also, a computer program can be downloaded from a satellite when the viewer is not watching a program. Therefore, the maintenance and service of the system of the personal computer can be improved.

The foregoing supervision by a computer program can be carried out independently for each external apparatus.

It is to be noted that the above-described feature of a personal computer can be included in the television receiver or a video tape recorder. The function of set top box 80 per se can be incorporated in a personal computer, a television receiver, a video tape receiver, or the like.

By the above-described structure of LNB 8, two receivers can be connected to one LNB 8. The two receivers can select a satellite and a polarized wave signal independently. Therefore, it is not necessary to install a separate satellite broadcast reception antenna for each satellite differing in the orbit position.

The switch bit selecting a satellite is formed of 4 bits. Therefore, the maximum of 16 (=24) satellites can be selected. For example, by using a 6×2 IF switch IC having 6 inputs and 2 outputs instead of 4×2 IF switch IC 32A, and adding an LNA, BPF, a mixer, an IF amplifier and the like similar to those of FIG. 3, a satellite broadcasting signal can be received from three satellites.

A buffer amplifier is connected between a local oscillator and a mixer for each satellite. Therefore, leakage of an RF (Radio Frequency) signal of a certain satellite to an RF signal of another satellite can be suppressed. The isolation of the RF signal between different satellite can be improved A HPF (High Pass Filter) or a rejecter (trap) can be used instead of BPF 28A–28D.

Although a satellite and a polarized wave signal are respectively selected using digital serial data and direct current DC in the above embodiment, a satellite and polarized wave signal can be selected by digital serial data alone.

Although IF amplifiers 34A and 34B are provided at the succeeding stage of 4×2 IF switch IC 32A, an IF amplifier can be provided at the preceding stage of 4×2 IF switch IC 32A to amplify in advance the intermediate frequency signal applied to 4×2 IF switch IC 32A.

Second Embodiment

Figure 5:
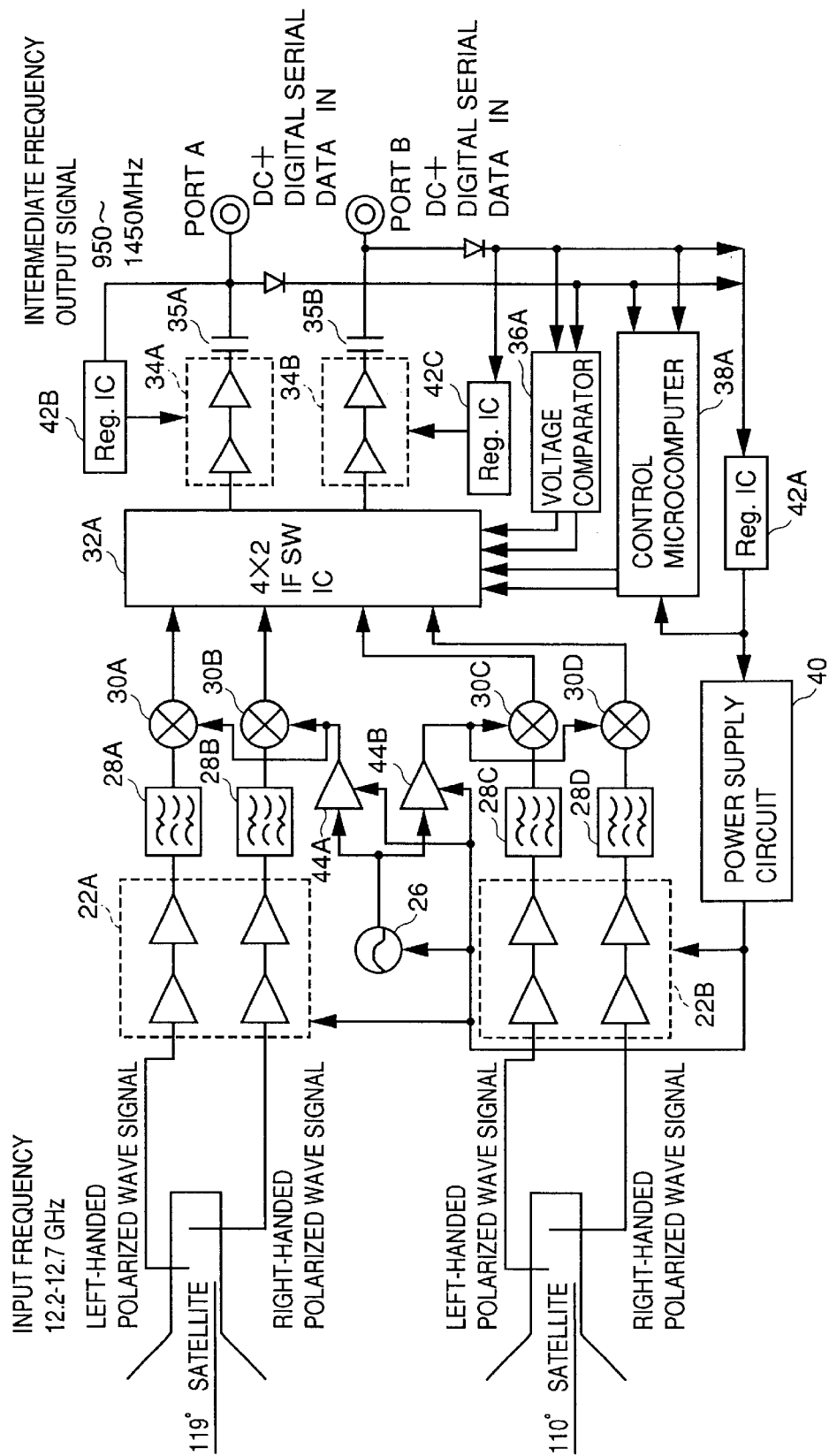
FIGS. 5, 6 and 7 show a structure of an LNB according to second, third, and fourth embodiments, respectively, of the present invention.

Referring to FIG. 5, an LNB according to a second embodiment of the present invention has constant voltage regulators 42B and 42C further added to LNB 8 of the first embodiment. Constant voltage regulator 42A supplies power to only power supply circuit 40 and control microcomputer 38A, and does not supply power supply IF amplifiers 34A and 34B.

Constant voltage regulator 42B is connected to output port A to regulate the voltage value, and then supplies power to IF amplifier 34A. Constant voltage regulator 42C is connected to output port B to regulate the voltage value, and supplies power to IF amplifier 34B.

By the above-described structure of the LNB, power can be supplied only to the IF amplifier to which a receiver is connected, and not supply power to the IF amplifier to which a receiver is not connected. Therefore, power is not supplied to the IF amplifier in the case where an IF signal does not have to be amplified. As a result, power consumption of the LNB can be reduced.

Third Embodiment

In the LNB of the previous first and second embodiments described with reference to FIGS. 3 and 5, the power to drive each component of the LNB is applied from both output ports A and B to constant voltage regulator 42A. The power applied from output ports A and B to constant voltage regulator 42A includes the two types of 18 V and 13 V. Assume that the entire current required to drive each component of the LNB is 200 mA. In the case where the voltage applied from output ports A and B to constant voltage regulator 42A are both 18 V or both 13 V, the current applied from output ports A and B to constant voltage regulator 42A is equally 100 mA. However, in the case where the voltage applied from one of output ports A and B is 18 V and the voltage applied from the other of output ports A and B is 13 V, the entire current of 200 mA is applied from the output port of the higher voltage.

The digital serial data supplied from output port A or B is a representation of the logic by the voltage value of 18 V or 13 V. When digital serial data is supplied from output port A, for example, the voltage value varies several times between 18 V and 13 V. This means that there are several transitions between the status where the entire current is supplied from one of output ports A and B and the status where equal current is supplied from output ports A and B. Therefore, not only the current applied from output port A, but also the current applied from output port B will vary. At output port B, voltage drop occurs by the presence of a coaxial cable connected to output port B. As a result, false digital serial data is generated at output port B. There was a problem that the LNB operates erroneously, so that a false satellite broadcasting signal is transmitted to the receiver connected to output port B. This phenomenon is particularly significant when the resistance of the coaxial cable connected to the output port is great or when the cable is long.

Figure 6:
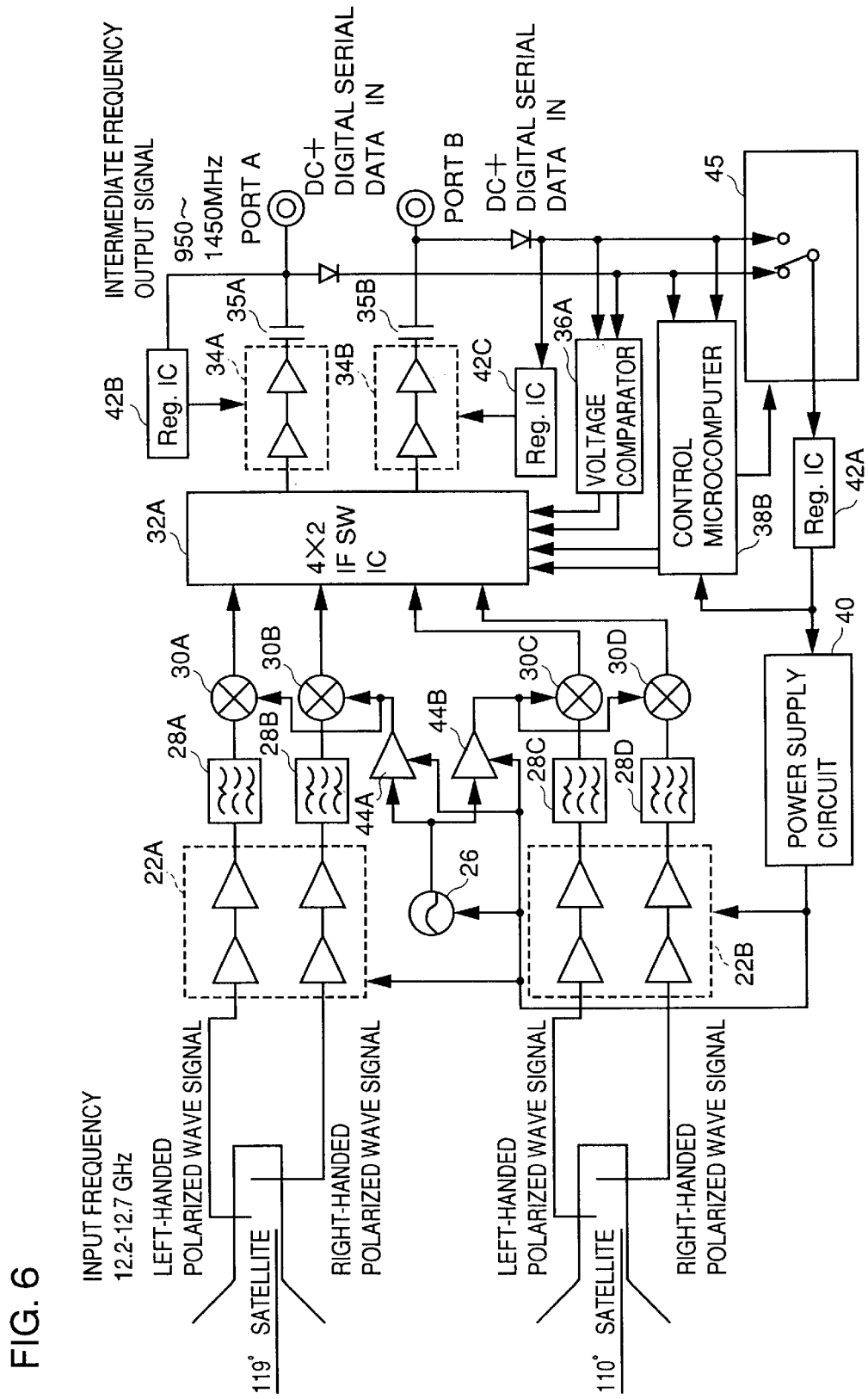

Referring to FIG. 6, an LNB according to a third embodiment of the present invention has a power switch 45 added to the LNB of the second embodiment, and uses a control microcomputer 38B instead of control microcomputer 38A. Power switch 45 includes two inputs and one output. The two inputs are connected to output ports A and B, respectively. The one output is connected to constant voltage regulator 42A. Power switch 45 receives power from either output port A or B according to the control signal from control microcomputer 38B and supplies the power to constant voltage regulator 42A.

Control microcomputer 38B is connected to output ports A and B to receive the digital serial data through respective output ports, and supplies a select signal of a satellite to 4×2 IF switch IC 32A according to the switch bit of the digital serial data. Also, when power is supplied from output port A, control microcomputer 38B provides a control signal to power switch 45 to cause the power supplied from output port A to be output by power switch 45. When power is not supplied from output port A, control microcomputer 38B applies to power switch 45 a control signal to cause power switch 45 to output the power supplied from output port B.

By the above-described structure, power to drive the LNB can be always supplied from output port A in the case where a receiver is connected to output port A. The current supplied from output port A is always constant, so that there is no change in the voltage at output port B. The problem of a false satellite broadcasting signal transmitted to the receiver connected to output port B by an erroneous operation of the LNB is eliminated. Therefore, the receiver can be operated stably.

Fourth Embodiment

Figure 7:
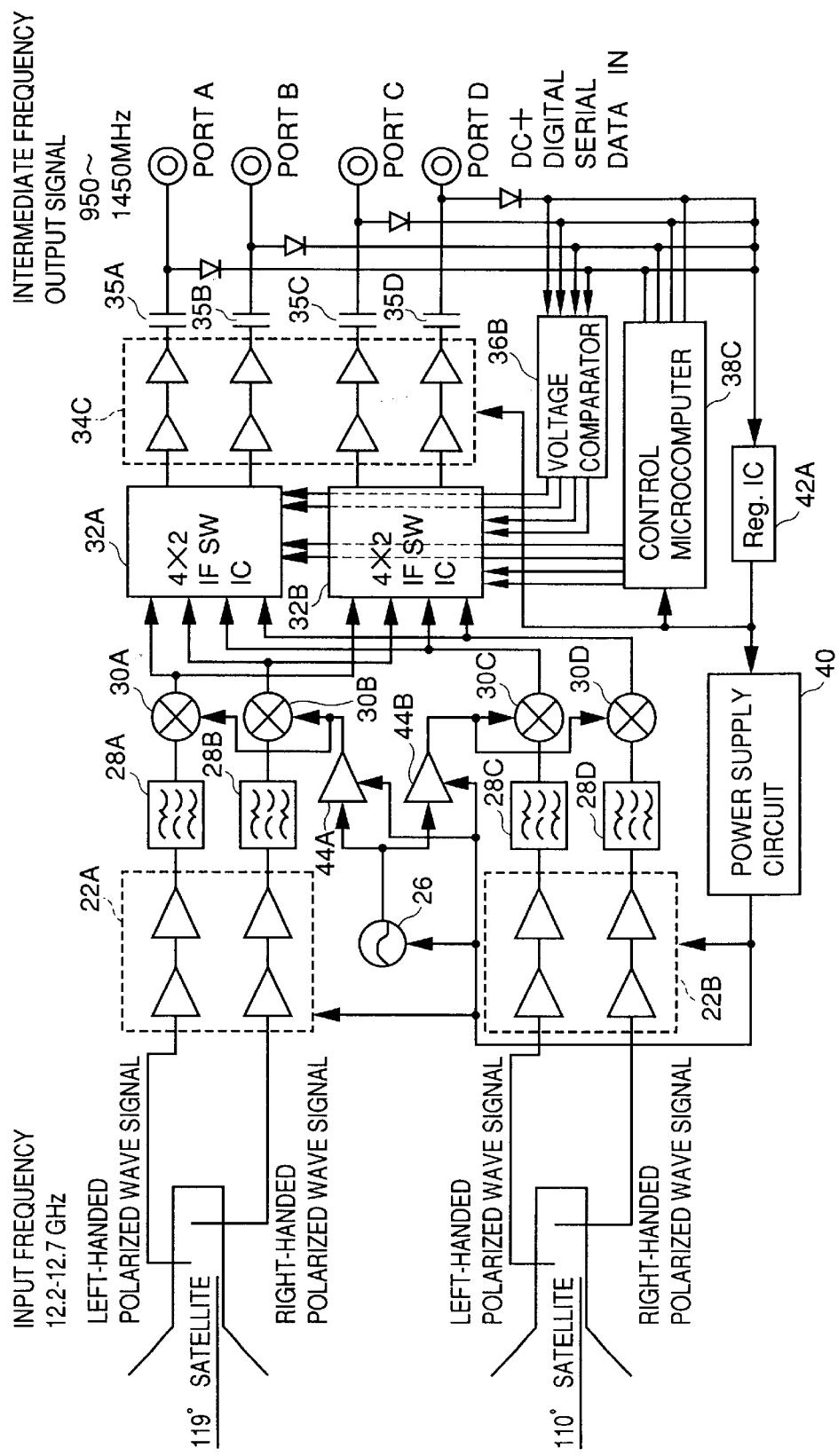
Figure 8:
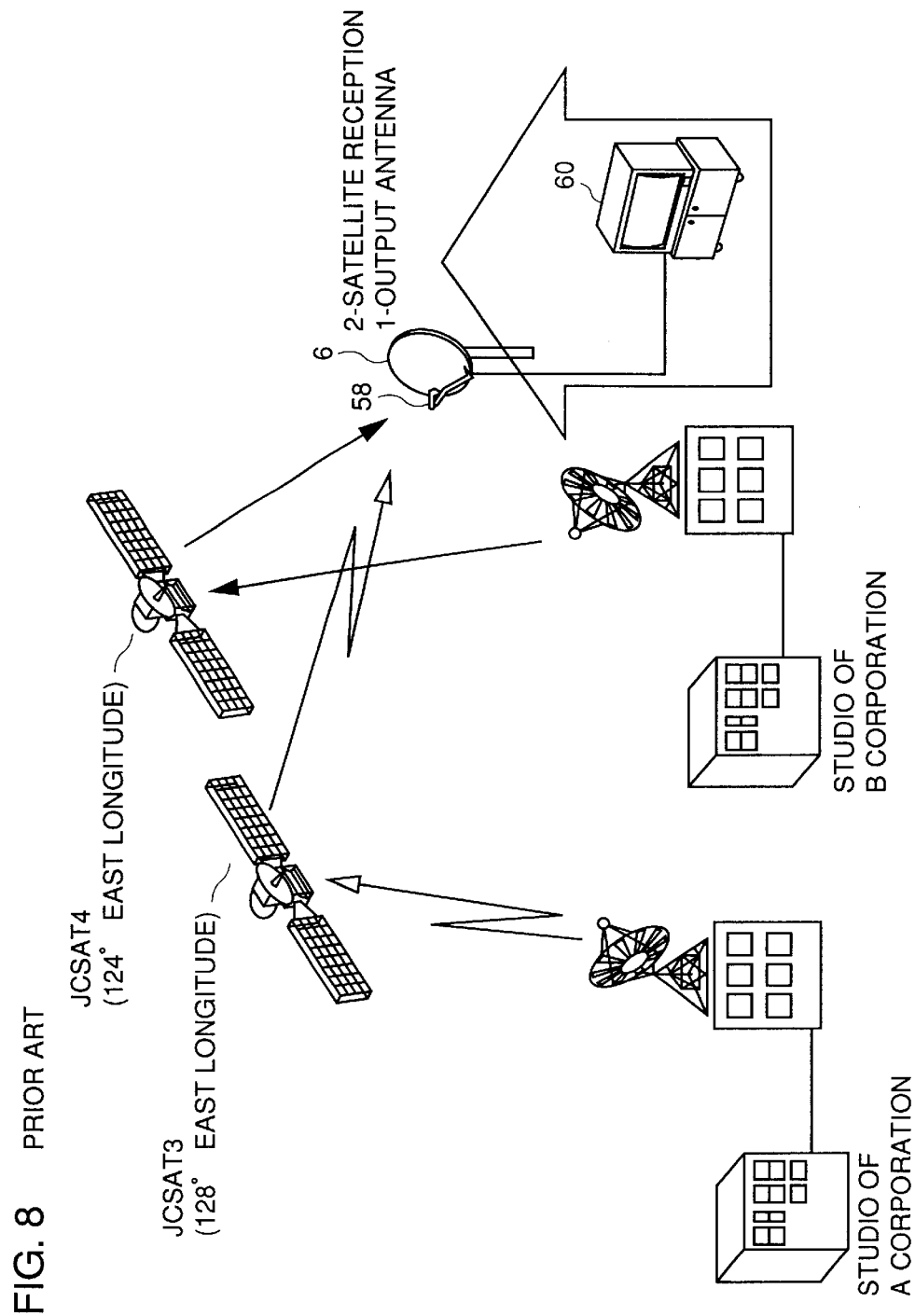
FIG. 8 is a diagram to describe a structure of a conventional satellite broadcast reception system.
Figure 9:
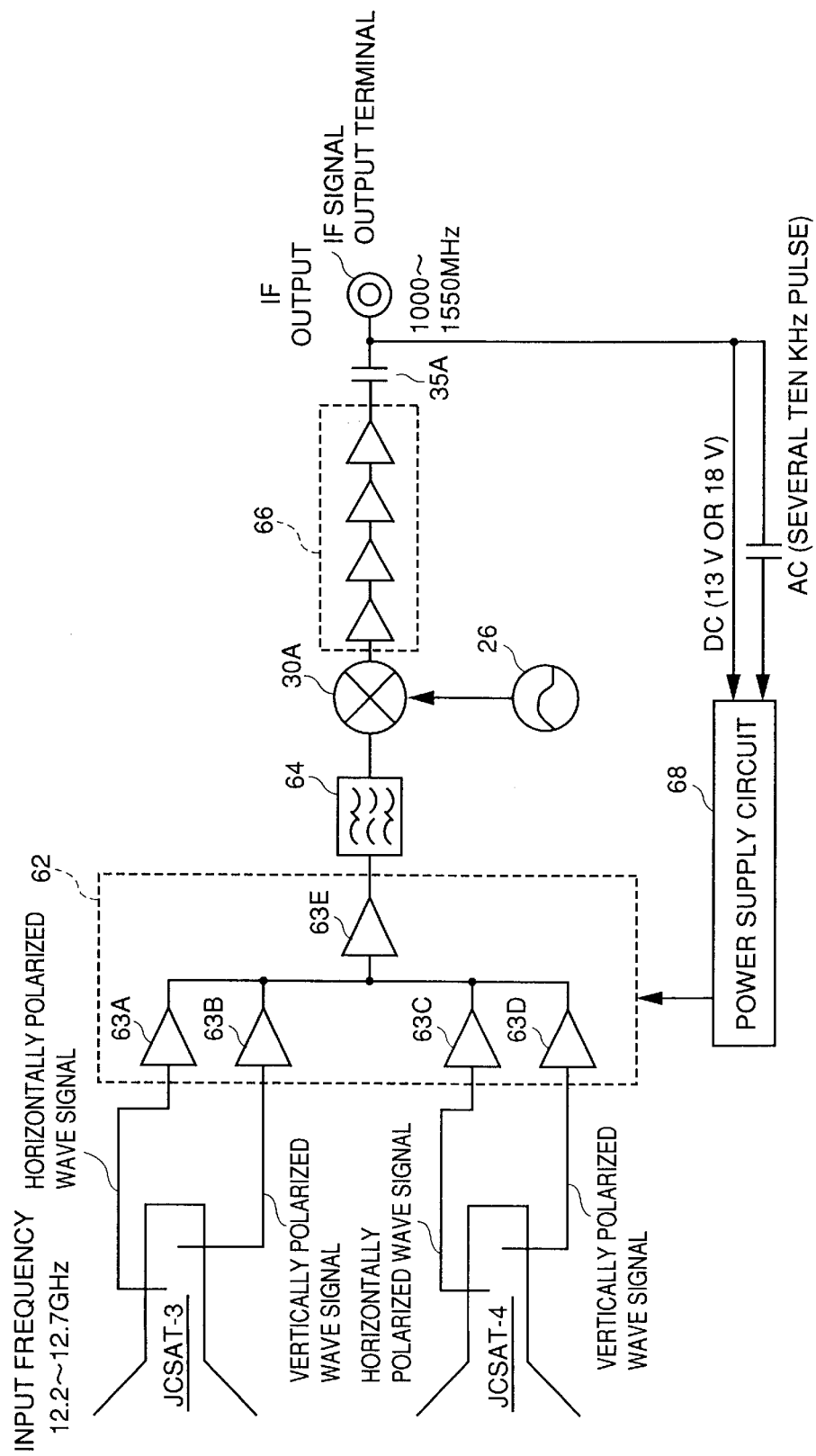
FIG. 9 shows a structure of a conventional LNB.

Referring to FIG. 7, an LNB according to a fourth embodiment of the present invention includes an LNA 22A receiving a left-handed polarized wave signal and a right-handed polarized wave signal transmitted from the 119° satellite, an LNA 22B receiving a left-handed polarized wave signal and right-handed polarized wave signal transmitted from the 110° satellite, BPF 28A and 28B connected to LNA 22A, BPF 28C and 28D connected to LNA 22B, a local oscillator 26, and buffer amplifiers 44A and 44B connected to local oscillator 26.

LNB further includes a mixer 30A connected to BPF 28A and buffer amplifier 44A, a mixer 30B connected to BPF 28B and buffer amplifier 44A, a mixer 30C connected to BPF 28C and buffer amplifier 44B, and a mixer 30D connected to BPF 28D and buffer amplifier 44B.

The LNB further includes 4×2 IF switches IC 32A and 32B connected to each of mixers 30A–30D to select an IF signal output from mixers 30A–30D according to the outputs of control microcomputer 38C and voltage comparator 36B and providing the selected IF signal from the two output ports, an IF amplifier 34C connected to the total of four output ports of 4×2 IF switches IC 32A and 32B, and capacitors 35A–35D connected to the output of IF amplifier 34 to cut the noise of the low frequency.

Output ports A–D of an IF signal are connected to capacitors 35A–35D, respectively. A receiver is connected at the end of output ports A–D.

The IF signal output from the total of four output ports of 4×2 IF switches IC 32A and 32B may be an IF signal of the same type or of a different type.

The LNB further includes a control microcomputer 38C connected to output ports A–D to receive digital serial data therefrom and applying a select signal of a satellite to 4×2 IF switches IC 32A and 32B according to the switch bit of the digital serial data, a voltage comparator 36B connected to operate ports A–D to receive direct current DC therefrom to compare with a predetermined threshold value and applying a select signal of a polarized wave signal to 4×2 IF switches IC 32A and 32B, a constant voltage regulator 42A connected to output ports A–D, and a power supply circuit 40 connected to constant voltage regulator 42A.

By using two 4×2 IF switches IC instead of 4×4 IF switch IC, an LNB having four output ports can be provided using components common to those of the LNB of the first embodiment.

By sequentially increasing the number of 4×2 IF switches IC, the number of the output ports of the LNB can be sequentially increased to six and eight.

By using a 6×2 IF switch IC described in the first embodiment instead of 4×2 IF switch IC and increasing the numbers of 6×2 IF switches IC to 2 and 4, an LNB that can receive a satellite broadcasting signal from three satellites having the number of output ports increased to 4 and 6 can be provided.

Fifth Embodiment

Figure 10:
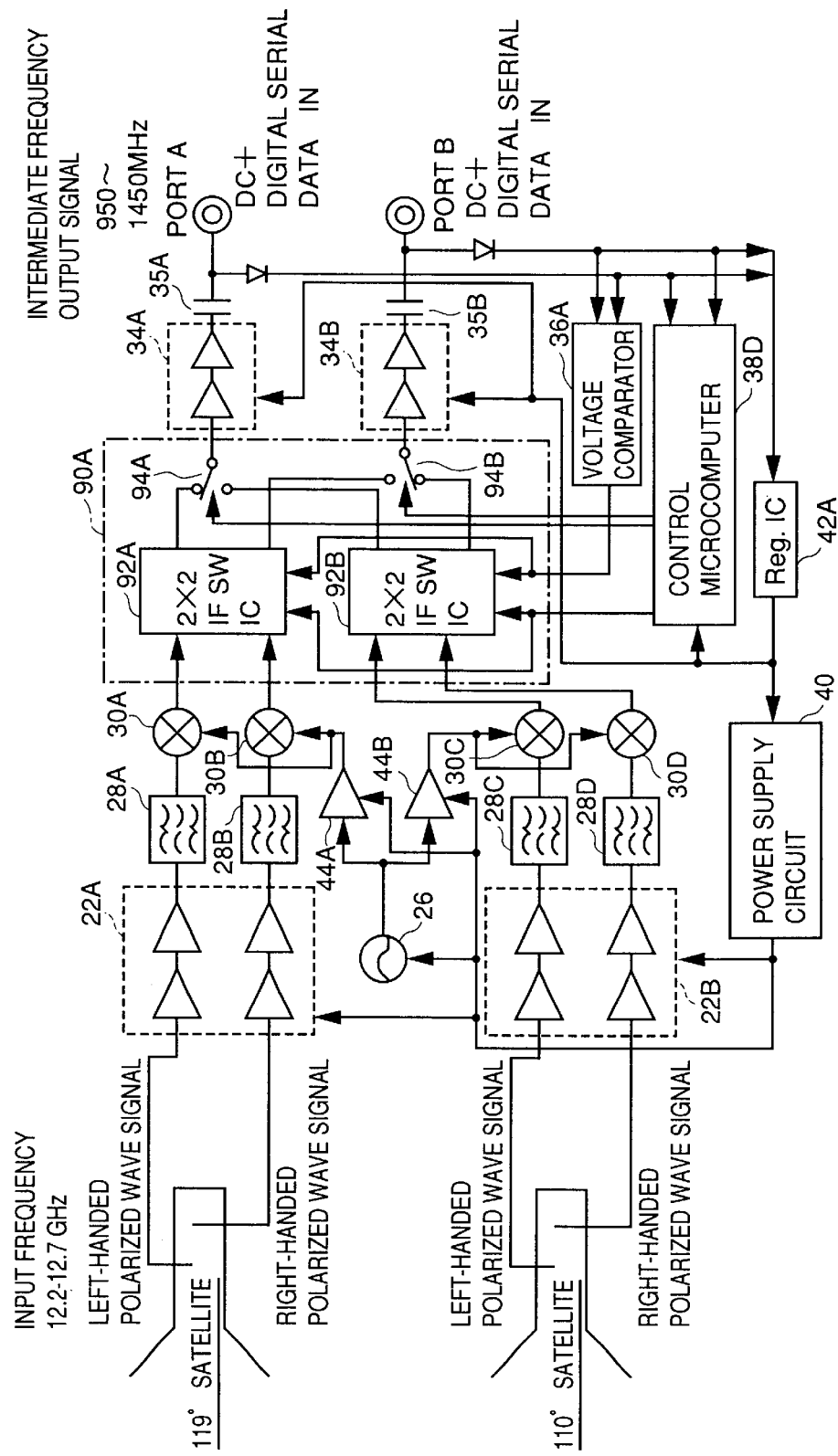
FIGS. 10, 11, 12 and 13 show a structure of an LNB according to fifth, sixth, seventh and eighth embodiments, respectively, of the present invention.

Referring to FIG. 10, an LNB according to a fifth embodiment of the present invention employs a switch unit 90A instead of 4×2 IF switch IC 32A and a control microcomputer 38D instead of control microcomputer 38A in LNB 8 of the first embodiment described with reference to FIG. 3.

Switch unit 90A includes a 2×2 IF switch IC 92A with the outputs of mixers 30A and 30B as the inputs to determine two outputs according to a port select signal from control microcomputer 38D and a select signal of a polarized wave signal output from voltage comparator 36A, and a 2×2 IF switch IC 92B with the outputs of mixers 30C and 30D as inputs to determine two outputs according to the port select signal from control microcomputer 38D and a select signal of a polarized wave signal output from voltage comparator 36A.

The first output (the output at the upper side in the drawing) of 2×2 IF switch IC 92A and the first output (the output at the upper side in the drawing) of 2×2 IF switch IC 92B are provided according to the select signal of a polarized wave signal with respect to port A. The second output (the output at the lower side in the drawing) of 2×2 IF switch IC 92A and the second output (the output at the lower side in the drawing) of 2×2 IF switch IC 92B are provided according to the select signal of a polarized wave signal with respect to port B.

Switch unit 90A further includes a switch 94A receiving the first output of 2×2 IF switch IC 92A and the first output of 2×2 IF switch IC 92B as inputs to provide one of the two inputs to IF amplifier 34A according to a select signal of a satellite related to port A output from control microcomputer 38D, and a switch 94B receiving the second output of 2×2 IF switch IC 92A and the second output of 2×2 IF switch IC 92B as inputs to provide one of the two inputs to IF amplifier 34B by a select signal of a satellite related to port B output from control microcomputer 38D.

For example, when the left-handed polarized wave signal of the 119° satellite is selected by the receiver connected to port A, control microcomputer 38D supplies a port select signal of port A to 2×2 IF switch IC 92A and 2×2 IF switch IC 92B. Voltage comparator 36A supplies a select signal of a left-handed polarized wave signal to 2×2 IF switch IC 92A and 2×2 IF switch IC 92B. As a result, the left-handed polarized wave signal of the 119° satellite is output from the first output of 2×2 IF switch IC 92A. A left-handed polarized wave signal of the 110° satellite is output from the first output of 2×2 IF switch IC 92B. Switch 94A receives a select signal of a satellite of the polarized wave signal output from control microcomputer 38D and provides the output of 2×2 IF switch IC 92A (the left-handed polarized wave signal of the 119° satellite) to IF amplifier 34A.

A similar operation is carried out for selection of a satellite and a polarized wave signal from the receiver connected to port B. Therefore, detailed description thereof will not be repeated here.

Switches 94A and 94B may be an assembly of circuit components such as a transistor, diode, capacitor, and a capacitor, or may be an IC or a mechanical switch such as a relay.

By implementing an LNB as described above, two receivers can be connected to one LNB. The two receivers can select a satellite and a polarized wave signal independently. Therefore, it is no longer necessary to install a satellite broadcast reception antenna independently for each satellite differing in orbit position.

Sixth Embodiment

Figure 11:
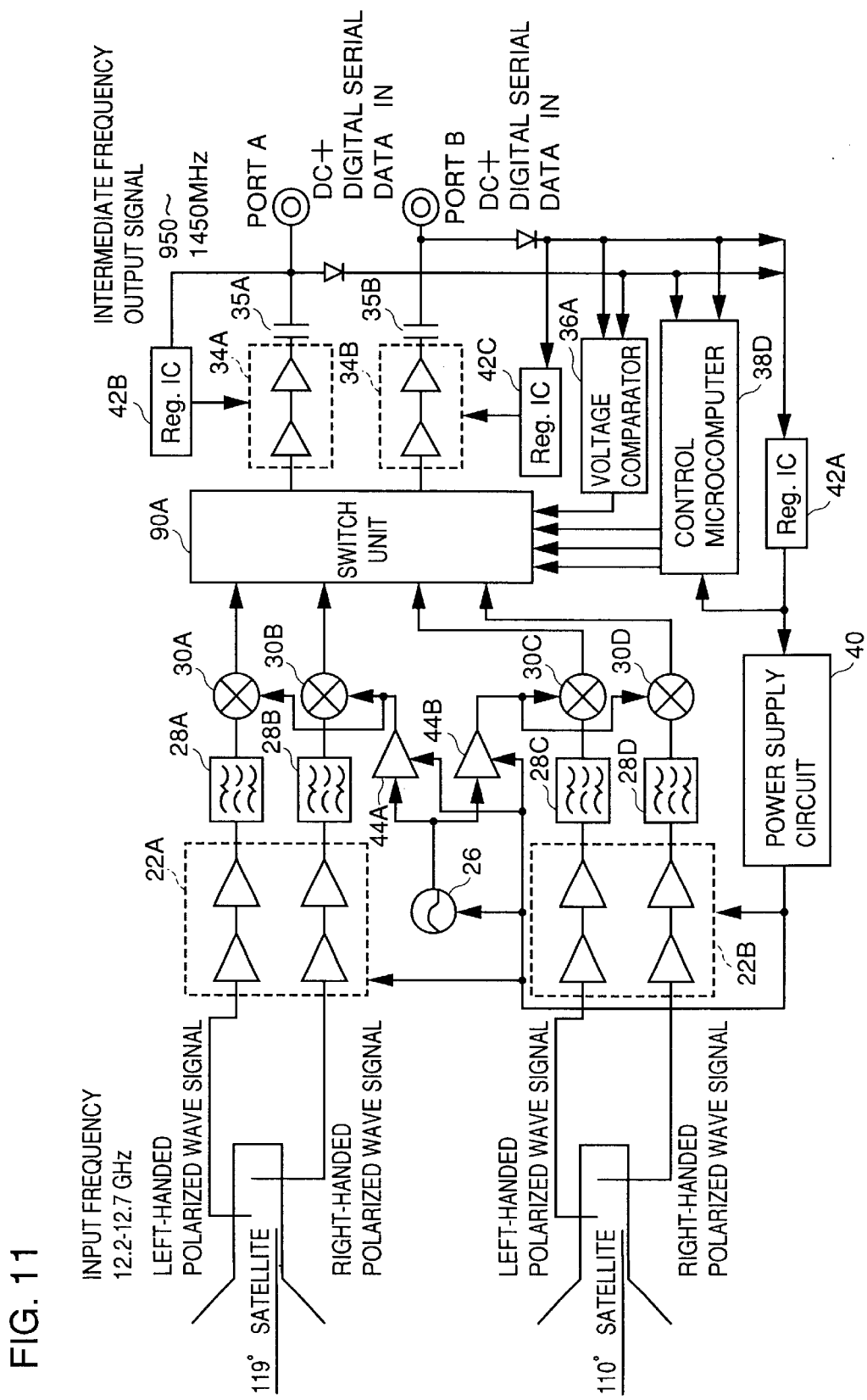

Referring to FIG. 11, an LNB according to a sixth embodiment of the present invention employs a switch unit 90A instead of 4×2 IF switch IC 32A, and a control microcomputer 38D instead of control microcomputer 38A in the LNB of the second embodiment described with reference to FIG. 5.

The structure and operation of switch unit 90A are similar to those described in the fifth embodiment. Therefore, detailed description thereof will not be repeated. The operation of control microcomputer 38D is similar to that described in the fifth embodiment. Therefore, detailed description thereof will not be repeated.

Constant voltage regulator 42A supplies power to only power supply circuit 40 and control microcomputer 38D, and not to IF amplifiers 34A and 34B.

Constant voltage regulator 42B is connected to output port A to regulate a voltage value, and then supplies power to IF amplifier 34A. Constant voltage regulator 42C is connected to output port B to regulate the voltage value, and then supplies power to IF amplifier 34B.

By implementing an LNB as described above, power can be supplied to only an IF amplifier to which a receiver is connected. Power supply to an IF amplifier to which a receiver is not connected can be suppressed. Therefore, power is not supplied to the IF amplifier when an IF signal does not have to be amplified. Thus, power consumption of the LNB can be reduced.

Seventh Embodiment

Figure 12:
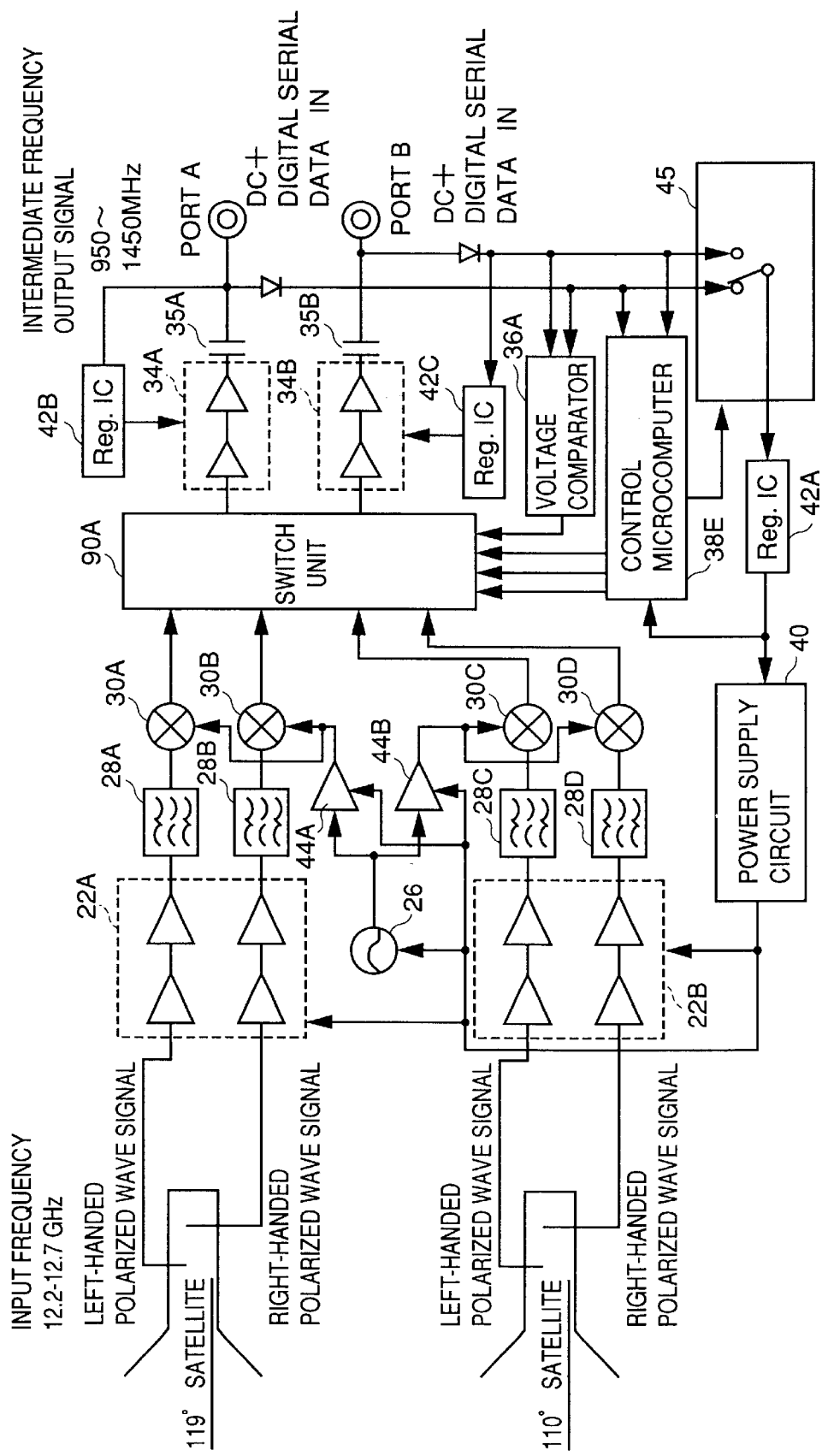

Referring to FIG. 12, an LNB according to a seventh embodiment of the present invention employs a switch unit 90A instead of 4×2 IF switch IC 32A and a control microcomputer 38E instead of control microcomputer 38B in the LNB of the third embodiment described with reference to FIG. 6.

The structure and operation of switch unit 90A are similar to those described in the fifth embodiment. Therefore, detailed description thereof will not be repeated.

Control microcomputer 38E is connected to output ports A and B to receive digital serial data therefrom, and supplies a select signal of a port of 2×2 IF switch IC 92A and 2×2 IF switch IC 92B (FIG. 10) in switch unit 90A and a select signal of a satellite to switch unit 90A according to the switch bit of the digital serial data. When power is supplied from output port A, control microcomputer 38E applies to power switch 45 a control signal to cause the power supplied from output port A to be output by power switch 45. In the case where power is not supplied from output port A, control microcomputer 38E supplies to power switch 45 a control signal to cause the power supplied from output port B to be output by power switch 45.

By the above-described structure, power to drive the LNB is always supplied from output port A in the case where a receiver is connected to output port A. Therefore, the current supplied from output port A is always constant, so that there is no change in the voltage at output port B. The problem of a false satellite broadcasting signal being transmitted to the receiver connected to output port B by an erroneous operation of the LNB is eliminated. Thus, the receiver can be operated stably.

Eighth Embodiment

Figure 13:
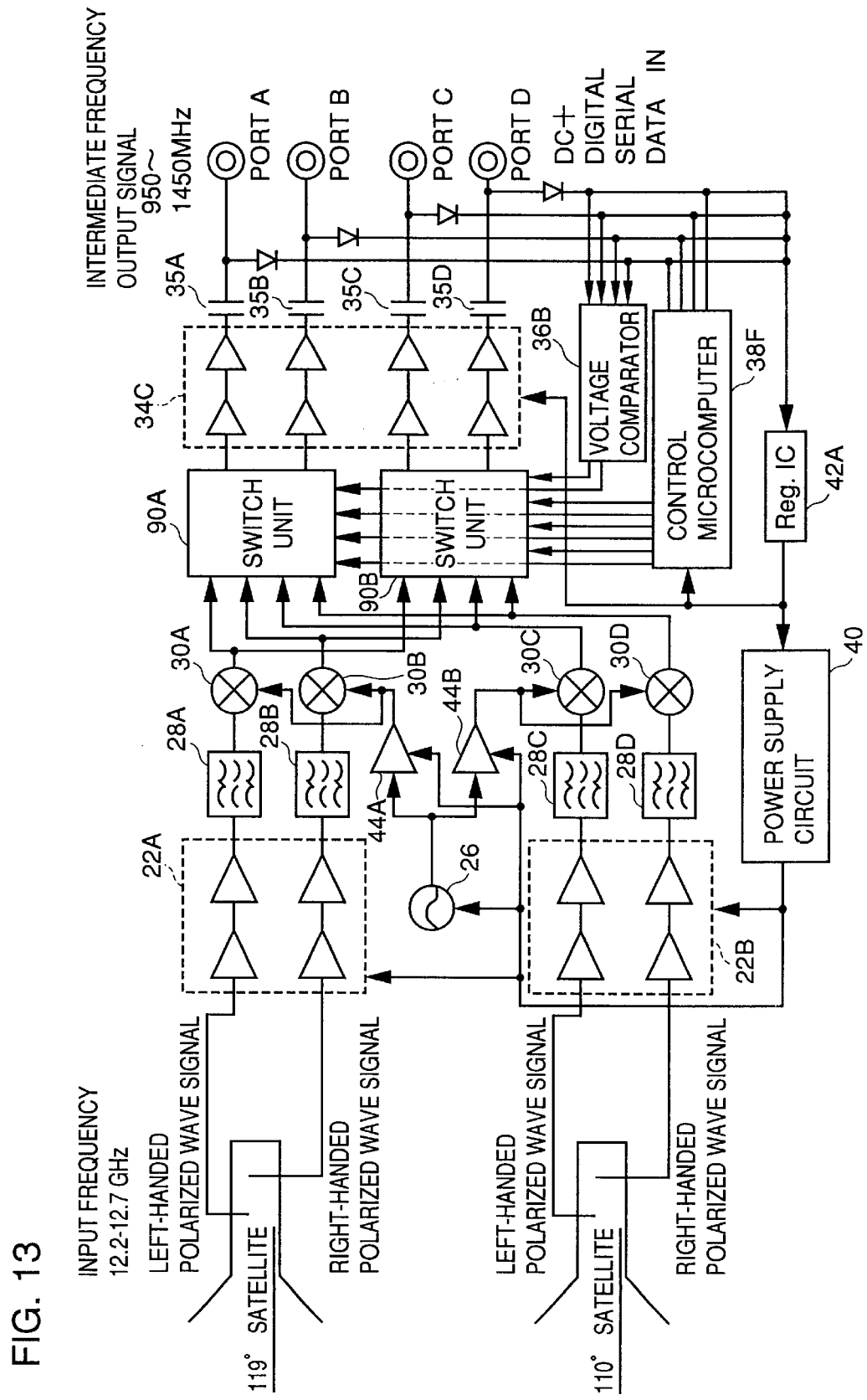

Referring to FIG. 13, an LNB according to an eighth embodiment of the present invention employs switch units 90A and 90B instead of 4×2 IF switches IC 32A and 32B, respectively, and a control microcomputer 38F instead of control microcomputer 38C in the LNB of the fourth embodiment described with reference to FIG. 7.

Control microcomputer 38F applies a select signal of a port of 2×2 IF switch IC 92A and 2×2 IF switch IC 92B (FIG. 10) and a select signal of a satellite to switch units 90A and 90B.

By using two switch units instead of 4×4 IF switch IC, an LNB having four output ports can be provided using components common to those of the LNB of the fifth embodiment.

Ninth Embodiment

The LNB of the sixth embodiment described with reference to FIG. 11 has the problem that delusive digital serial data is generated at output port A or B, as described also in the third embodiment.

Figure 14:
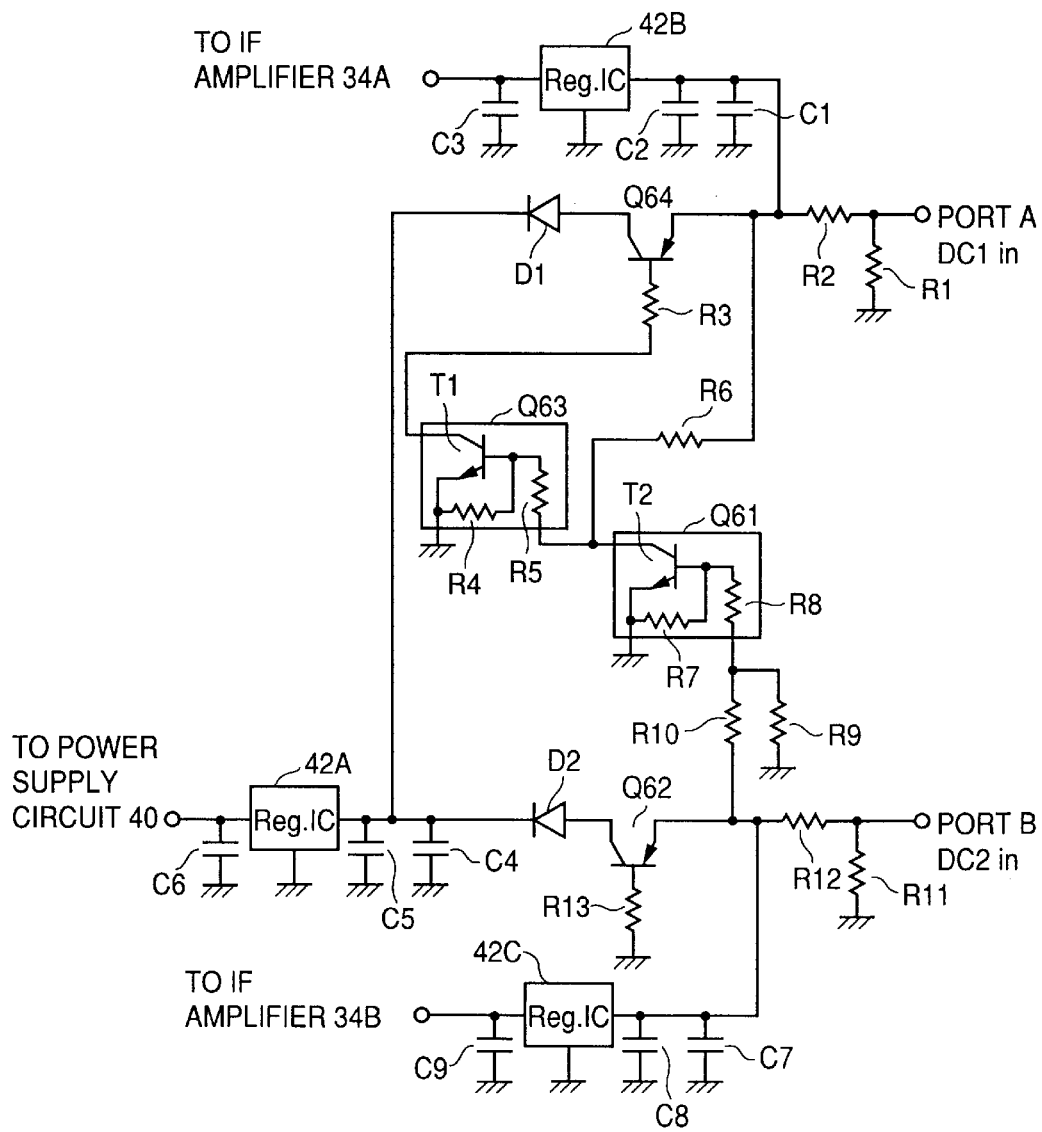
FIGS. 14 and 15 are diagrams of a circuit to supply voltage from ports A and B of the LNB of FIGS. 11 and 12, respectively, to the main circuits of the LNB.

FIG. 14 is a diagram of the circuit to supply voltage to the main circuitry of the LNB from ports A and B of the LNB of FIG. 11.

Referring to FIG. 14, the circuit includes a resistor R1 having one end connected to port A and the other end connected to ground, a resistor R2 having one end connected to port A, a capacitor C1 having one end connected to the other end of resistor R2 and the other end connected to ground, a capacitor C2 having one end connected to the other end of resistor R2 and the other end connected to ground, a constant voltage regulator 42B having one end connected to the other end of resistor R2, and a capacitor C3 having one end connected on the path of constant voltage regulator 42B and IF amplifier 34A and the other end connected to ground.

The circuit further includes a transistor Q64 having an emitter connected to the other end of resistor R2, a diode D1 connected to a collector of transistor Q64, a resistor R3 having one end connected to a base of transistor Q64, a digital transistor Q63 connected to the other end of resistor R3, a digital transistor Q61 connected to digital transistor Q63, a resistor R6 having one end connected to the other end of resistor R2 and the other end connected on a path coupling digital transistors Q63 and Q61, and a resistor R9 having one end connected to digital transistor Q61 and the other end connected to ground.

The circuit further includes a resistor R11 having one end connected to port B and the other end connected to ground, a transistor R12 having one end connected to port B, a resistor R10 having one end connected to digital transistor Q61 and the other end connected to the other end of transistor R12, a transistor Q62 having an emitter connected to the other end of resistor R12, a resistor R13 having one end connected to a base of transistor Q62 and the other end connected to ground, a diode D2 having one end connected to a collector of transistor Q62 and the other end connected to constant voltage regulator 42A, a capacitor C4 having one end connected to the output of diode D2 and the other end connected to ground, a capacitor C5 having one end connected to the outputs of diodes D1 and D2 and the other end connected to ground, a constant voltage regulator 42A having one end connected to the outputs of diodes D1 and D2, and a capacitor C6 having one end connected on a path coupling constant voltage regulator 42A and power supply circuit 40 and the other end connected to ground.

The circuit further includes a capacitor C7 having one end connected to the other end of resistor R12 and the other end connected to ground, a capacitor C8 having one end connected to the other end of resistor R12 and the other end connected to ground, a constant voltage regulator 42C connected to the other end of resistor R12, and a capacitor C9 having one end connected on a path coupling constant voltage regulator 42C and IF amplifier 34B and the other end connected to ground.

Digital transistor Q63 includes a transistor T1 having a collector connected to the other end of resistor R3 and an emitter connected to ground, a resistor R3 having one end connected to a base of transistor T1 and the other end connected to ground, and a resistor R5 having one end connected to the base of transistor T1 and the other end connected to resistor R6.

Digital transistor Q61 includes a transistor T2 having a collector connected to the other end of resistor R5 and an emitter connected to ground, a resistor R7 having one end connected to a base of transistor T2 and the other end connected to ground, and a resistor R8 having one end connected to the base of transistor T2 and the other end connected to one end of resistor R10.

The power to drive each component in the LNB is supplied from both of output ports A and B to constant voltage regulator 42A. The power applied from output ports A and B to constant voltage regulator 42A has the two voltage values of 18 V and 13 V. It is assumed that the entire current required to drive each component of the LNB is 200 mA. When the voltages applied from output ports A and B to constant voltage regulator 42A are both 18 V or both 13 V, the current applied from output ports A and B to constant voltage regulator 42A is equally 100 mA However, in the case where the voltage applied from one of output ports A and B is 18 V and the other of the output ports A and B is 13 V, the total current of 200 mA will be output from the output port of the higher voltage.

The digital serial data supplied from output port A or B is a representation of the logic by the voltage values of 18 V or 13 V. When digital serial data is supplied from output port A, for example, the voltage value varies over several times between 18 V and 13 V. This means that there are several transitions between the state where the entire current is supplied from one of output ports A and B and the state where equal currents are supplied from output ports A and B. Therefore, not only the current applied from output port A, but also the current applied from output port B will change. At output port B, voltage drop occurs due to the presence of a coaxial cable connected to output port B, whereby false digital serial data will be generated at output port B. Therefore, the LNB will operate erroneously. There was a problem that a false satellite broadcasting signal is transmitted to the receiver connected to output port B. This phenomenon is particularly significant in the case where the resistance of the coaxial cable connected to the output port is large or when the cable is long.

The LNB of the present embodiment has a structure similar to that of the LNB of the seventh embodiment described with reference to FIG. 12. Therefore, detailed description thereof will not be repeated.

Figure 15:
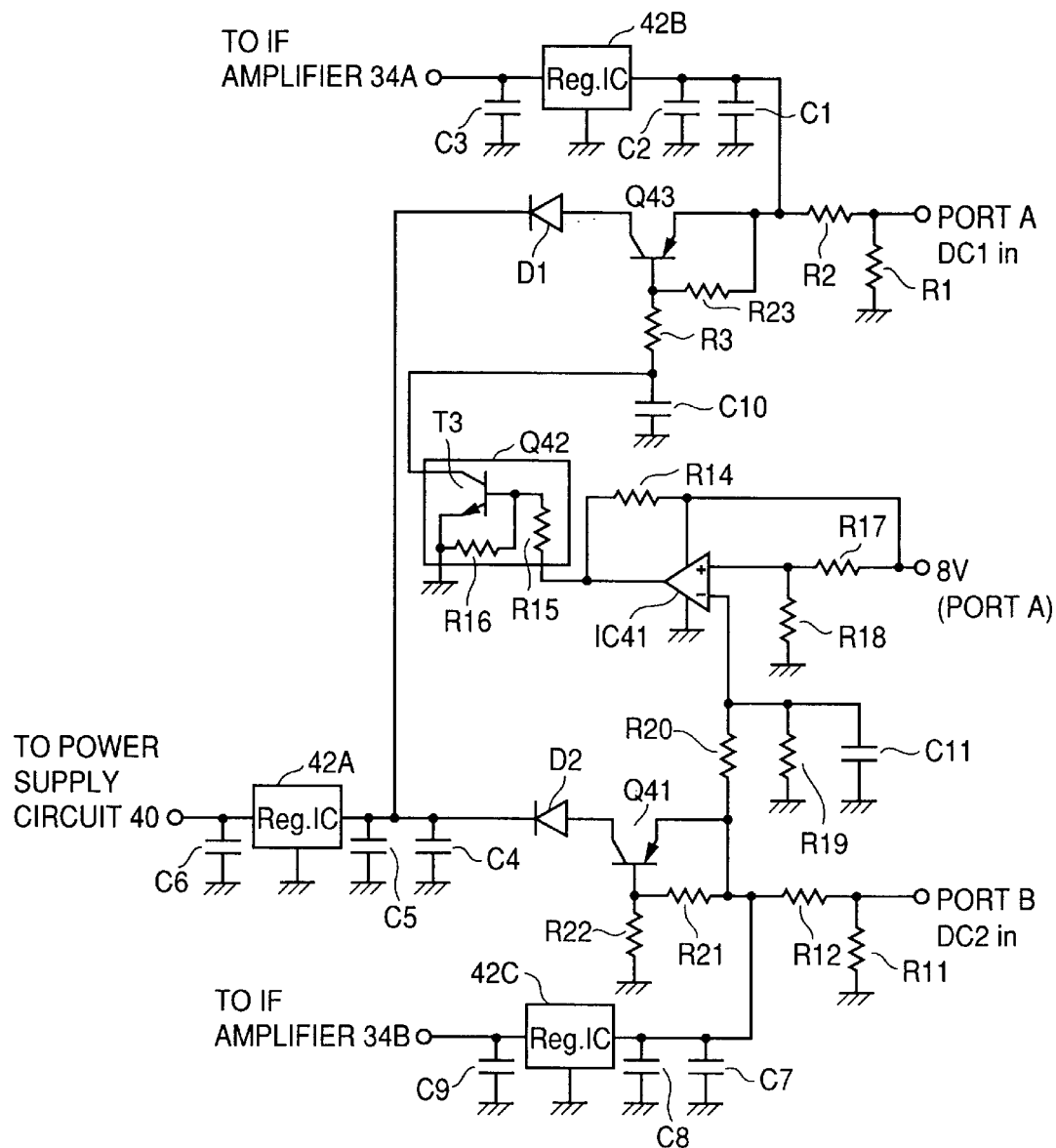

FIG. 15 is a diagram of a circuit to supply voltage from ports A and B of the LNB of FIG. 12 to the main circuitry of the LNB.

Referring to FIG. 15, the circuit includes a resistor R1 having one end connected to port A and the other end connected to ground, a resistor R2 having one end connected to port A, a capacitor C1 having one end connected to the other end of resistor R2 and the other end connected to ground, a capacitor C2 having one end connected to the other end of resistor R2 and the other end connected to ground, a constant voltage regulator 42B connected to the other end of resistor R2, and a capacitor C3 having one end connected on a path coupling constant voltage regulator 42B and IF amplifier 34A and the other end connected to ground.

The circuit further includes a transistor Q43 having an emitter connected to the other end of resistor R2, a resistor R23 having one end connected to the other end of resistor R2 and the other end connected to the base of transistor Q43, a resistor R3 having one end connected to the base of transistor Q43, a capacitor C10 having one end connected to the other end of resistor R3 and the other end connected to ground, a diode D1 connected to a collector of transistor Q43, a resistor R17 having one end connected to port A from which current of the voltage of 8 volts is supplied, a resistor R18 having one end connected to the other end of resistor R17 and the other end connected to ground, a comparator IC 41 connected to port A from which 8 Volts is supplied and receiving one potential of resistor R18 at a plus terminal, a resistor R14 having one end connected to port A from which 8 volts is supplied and the other end connected to the output of comparator IC 41, and a digital transistor Q42 connected to the other end of resistor R3 and the output of comparator IC 41.

The circuit further includes a capacitor C11 having one end connected to a minus terminal of comparator IC 41 and the other end connected to ground, a resistor R19 having one end connected to the minus terminal of comparator IC 41 and the other end connected to ground, a resistor R11 having one end connected to port B and the other end connected to ground, a resistor R12 having one end connected to port B, a resistor R20 having one end connected to the minus terminal of comparator IC 41, a resistor R21 having one end connected to the other end of resistor R12, a transistor Q41 having an emitter connected to the other end of resistor R20 and a base connected to the other end of resistor R21, a diode D2 connected to a collector of transistor Q41, a capacitor C41 having one end connected to the output of diode D2 and the other end connected to ground, a capacitor C5 having one end connected to the outputs of diodes D1 and D2 and the other end connected to ground, a constant voltage regulator 42A having one end connected to the outputs of diodes D1 and D2, and a capacitor C6 having one end connected on a path coupling constant voltage regulator 42A and power supply circuit 40 and the other end connected to ground.

The circuit also includes a resistor R22 having one end connected to the base of transistor Q41 and the other end connected to ground, a capacitor C7 having one end connected to an emitter of transistor Q41 and the other end connected to ground, a capacitor C8 having one end connected to the emitter of transistor Q41 and the other end connected to ground, a constant voltage regulator 42C having one end connected to the emitter of transistor Q41, and a capacitor C9 having one end connected on a path coupling constant voltage regulator 42C and amplifier 34B, and the other end connected to ground.

Digital transistor Q42 includes a transistor T3 having a collector connected to the other end of transistor R3 and an emitter connected to ground, a resistor R16 having one end connected to a base of transistor T3 and the other end connected to ground, and a resistor R15 having one end connected to a base of transistor T3 and the other end connected to an output of comparator IC 41.

The principle of the operation of the circuit shown in FIG. 15 will be described hereinafter.

(1) When a receiver is connected to port B, the voltage supplied from port B is 13 V or 18 V. Therefore, the output of comparator IC 41 is always at a low level. When the output of comparator IC 41 attains a low level, the outputs of digital transistor Q42 and transistor Q43 both attain a low level. Therefore, a voltage is supplied from port B to constant voltage regulator 42A. In this case, voltage is not supplied from port A to constant voltage regulator 42A even if port A is used.

(2) When port B does not have a receiver connected and is open, the output of comparator IC 41 attains a high level. In response, the outputs of digital transistor Q42 and transistor Q43 are driven to a high level. Therefore, voltage is supplied from port A to constant voltage regulator 42A.

Thus, even when the voltage of port A or port B changes, voltage is always supplied from one port. Therefore, the current consumed at each port will not change. Accordingly, the problem of a false satellite broadcasting signal being transmitted to the receiver connected to the output port caused by an erroneous operation of the LNB is eliminated. Therefore, the receiver can be operated stably.

Tenth Embodiment

Figure 16:
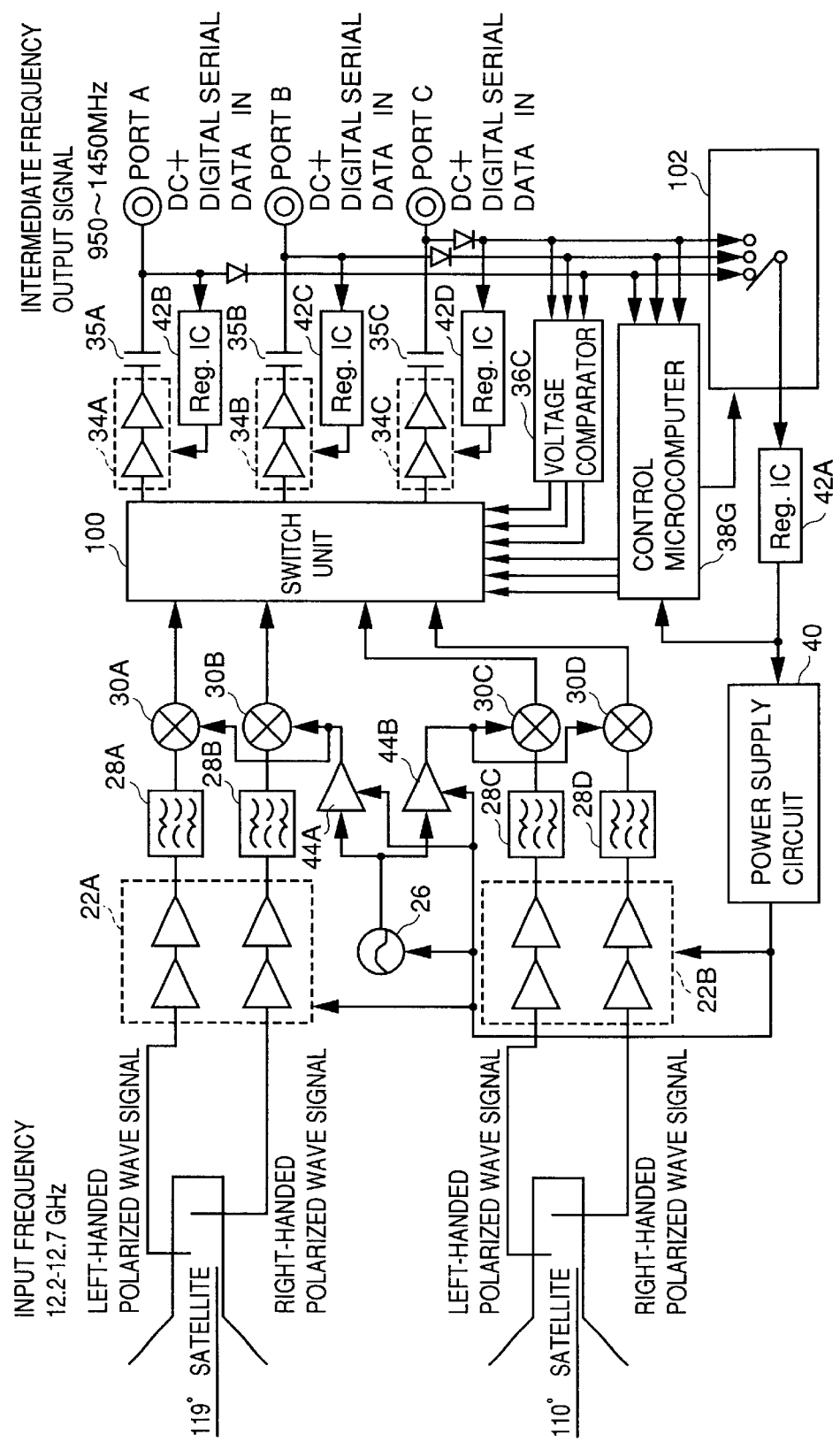
FIG. 16 shows a structure of an LNB according to a tenth embodiment of the present invention.

Referring to FIG. 16, an LNB according to a tenth embodiment of the present invention includes an LNA 22A receiving a left-handed polarized wave signal and a right-handed polarized wave signal transmitted from the 119° satellite to amplify the low noise of respective polarized wave signals, an LNA 22B receiving a left-handed polarized wave signal and a right-handed polarized wave signal transmitted from the 110° satellite to amplify the low noise of respective polarized wave signals, BPF 28A and 28B connected to LNA 22A to remove image signals of respective left-handed and right-handed polarized wave signals amplified in low noise, BPF 28C and 28D connected to LNA 22B to remove image signals from respective left-handed and right-handed polarized wave signals amplified in low noise, a local oscillator 26 generating a sine wave signal (local oscillator signal) of 11.25 GHz, and buffer amplifiers 44A and 44B connected to local oscillator 26.

The LNB further includes a mixer 30A connected to BPF 28A and buffer amplifier 44A to mix the outputs of BPF 28A and buffer amplifier 44A and providing an IF signal, a mixer 30B connected to BPF 28B and buffer amplifier 44A to mix outputs thereof and providing an IF signal, a mixer 30C connected to BPF 28C and buffer amplifier 44B to mix outputs thereof and providing an IF signal, and a mixer 30D connected to BPF 28D and buffer amplifier 44B to mix outputs thereof and providing an IF signal.

The LNB further includes a switch unit 100 connected to mixers 30A–30D to select the output signal output from mixers 30A–30D according to the outputs of control microcomputer 38G and voltage comparator 36C and providing the IF signals from the three output ports, IF amplifiers 34A–34C connected to the three output ports, respectively, of switch unit 100, and capacitors 35A–35C connected to the outputs of IF amplifiers 34A–34C, respectively, to cut the noise of the low frequency.

Capacitors 35A–35C are connected to output ports A–C, respectively, of an IF signal. The end of output ports A–C is connected to respective receivers.

The IF signals output from the three output ports of switch unit 100 may be IF signals of the same type or of a different type. Switch unit 100 carries out an operation similar to that of 4×2 IF switch IC 32A.

The LNB further includes a control microcomputer 38G connected to output ports A–C to receive serial data from a receiver connected to respective output ports, and applying a select signal of satellite to switch unit 100 according to the switch bit of the digital serial data, and a voltage comparator 36C connected to output ports A–C to receive direct current DC from respective output ports to compare with a predetermined threshold value and applying a select signal of a polarized wave signal to switch unit 100.

The LNB further includes a constant voltage regulator 42B connected to port A to regulate the voltage value and supplying power of a constant voltage value to IF amplifier 34A, a constant voltage regulator 42C connected to port B to regulate the voltage value and supplying power of a constant voltage value to IF amplifier 34B, and a constant voltage regulator 42D connected to port C to regulate the voltage value and supplying power of a constant voltage value to IF amplifier 34C.

The LNB further includes a power switch 102 receiving power from any of output ports A–C for output according to a control signal output from control microcomputer 38G, a constant voltage regulator 42A connected to the output of power switch 102 to regulate the voltage value and supplying power of a constant voltage value to control microcomputer 38G and power supply circuit 40, and a power supply circuit 40 connected to constant voltage regulator 42A to convert the power supplied from constant voltage regulator 42A into a desired voltage current, and supplying that current to LNA 22A and 22B, buffer amplifiers 44A and 44B, local oscillator 26, and the like.

Figure 17:
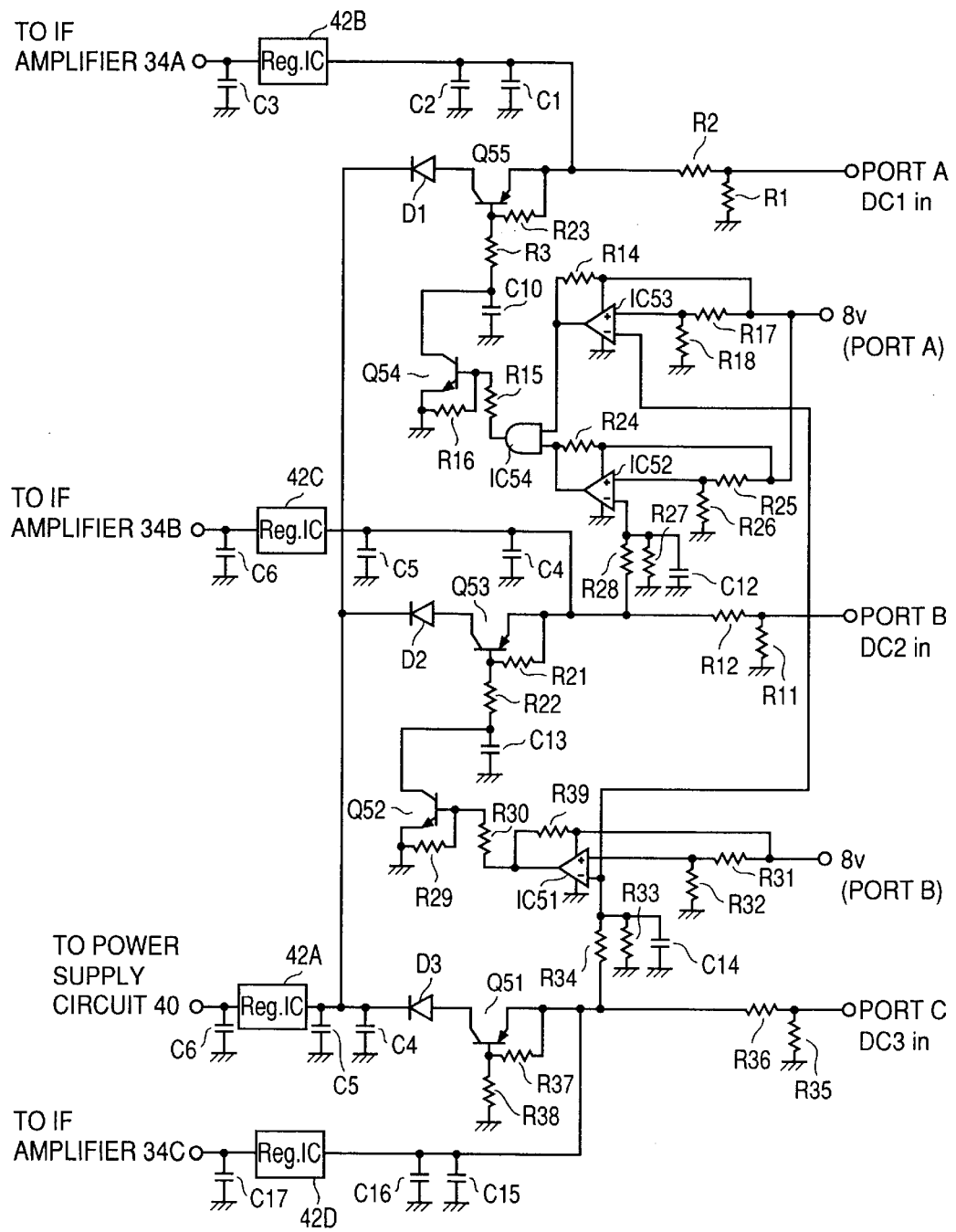
FIG. 17 is a circuit diagram to supply voltage from ports A–C of the LNB of FIG. 16 to the main circuits of the LNB.

FIG. 17 is a diagram of a circuit to supply voltage to the main circuitry of the LNB from ports A–C of the LNB of FIG. 16. Mainly the structure of power switch 102 is shown.

Referring to FIG. 17, the circuit includes a resistor R1 having one end connected to port A and the other end connected to ground, a resistor R2 having one end connected to port A, a capacitor C1 having one end connected to the other end of resistor R2 and the other end connected to ground, a capacitor C2 having one end connected to the other end of resistor R2 and the other end connected to ground, a constant voltage regulator 42B connected to the other end of resistor R2, and a capacitor C3 having one end connected on a path coupling constant voltage regulator 42B and IF amplifier 34A and the other end connected to ground.

The circuit further includes a transistor Q55 having an emitter connected to the other end of resistor R2, a resistor R23 having one end connected to the other end of resistor R2 and the other end connected to a base of transistor Q55, a diode D1 connected to a collector of transistor Q55, a resistor R3 having one end connected to the base of transistor Q55, a capacitor C10 having one end connected to the other end of resistor R3 and the other end connected to ground, a transistor Q54 having a collector connected to the other end of resistor R3 and an emitter connected to ground, and a resistor R16 having one end connected to a base of transistor Q54 and the other end connected to ground.

The circuit further includes a resistor R17 having one end connected to port A supplying the voltage of 8 volts, a resistor R18 having one end connected to the other end of resistor R17 and the other end connected to ground, a comparator IC 53 connected to port A supplying 8 volts and having a plus terminal connected to the other end of resistor R17, a resistor R14 having one end connected to port A supplying the voltage of 8 volts, a resistor R25 having one end connected to port A supplying the voltage of 8 volts, a resistor R26 having one end connected to the other end of resistor R25 and the other end connected to ground, a comparator IC 52 connected to port A supplying 8 volts and having a plus terminal connected to the other end of resistor R25, a capacitor C12 having one end connected to the minus terminal of comparator IC 52 and the other end connected to ground, a resistor R27 having one end connected to the minus terminal of comparator IC 52 and the other end connected to ground, a resistor R24 having one end connected to port A supplying 8 volts and the other end connected to the output of comparator IC 52, a 2-input AND circuit IC 54 receiving the outputs of comparators IC 53 and IC 52 as inputs, and a resistor R15 having one end connected to the output of AND circuit IC 54 and the other end connected to the base of transistor Q54.

The circuit further includes a resistor R11 having one end connected to port B and the other end connected to ground, resistor R12 having one end connected to port B, a resistor R28 having one end connected to the minus terminal of comparator IC 52 and the other end connected to the other end of resistor R12, a capacitor C4 having one end connected to the other end of resistor R12 and the other end connected to ground, a capacitor C5 having one end connected to the other end of resistor R12 and the other end connected to ground, a constant voltage regulator 42C connected to the other end of resistor R12, and a capacitor C6 having one end connected on a path coupling constant voltage regulator 42C and IF amplifier 34B and the other end connected to ground.

The circuit further includes a transistor Q53 having an emitter connected to the other end of resistor R12, a diode D2 connected to a collector of transistor Q53 and having an output connected to the output of diode D1, a resistor R21 having one end connected to the other end of resistor R12 and the other end connected to a base of transistor Q53, a resistor R22 having one end connected to a base of transistor Q53, a capacitor C13 having one end connected to the other end of resistor R22 and the other end connected to ground, a transistor Q52 having a collector connected to the other end of resistor R22 and an emitter connected to ground, and a resistor R29 having one end connected to a base of transistor Q52 and the other end connected to ground. The circuit further includes a resistor R31 having one end connected to port B supplying a voltage of 8 volts, a resistor R32 having one end connected to the other end of resistor R31 and the other end connected to ground, a comparator IC 51 connected to port B supplying a voltage of 8 volts and the plus terminal connected to the other end of resistor R31, a resistor R39 having one end connected to port B supplying 8 volts and the other end connected to the output of comparator IC 51, a resistor R30 having one end connected to the output of comparator IC 51 and the other end connected to the base of transistor Q52, a capacitor C14 having one end connected to the minus terminal of comparator IC 51 and the other end connected to ground, and a resistor R33 having one end connected to the minus terminal of comparator IC 51 and the other end connected to ground.

The circuit further includes a resistor R35 having one end connected to port C and the other end connected to ground, a resistor R36 having one end connected to port C, a resistor R34 having one end connected to the minus terminal of comparator IC 51 and the other end connected to ground, a capacitor C15 having one end connected to the other end of resistor R34 and the other end connected to ground, a capacitor C16 having one end connected to the other end of resistor R34 and the other end connected to ground, a constant voltage regulator 42D having one end connected to the other end of resistor R34, and a capacitor C17 having one end connected to a path coupling constant voltage regulator 42D and IF amplifier 34C and having the other end connected to ground.

The circuit further includes a transistor Q51 having an emitter connected to the other end of resistor R34, a resistor R37 having one end connected to an emitter of transistor Q51 and the other end connected to a base of transistor Q51, a resistor R38 having one end connected to a base of transistor Q51 and the other end connected to ground, a diode D3 connected to a collector of transistor Q51, a capacitor C4 having one end connected to the output of diode D3 and the other end connected to ground, a capacitor C5 having one end connected to the output of diode D3 and the other end connected to ground, a constant voltage regulator 42A connected to the output of diode G3, and a capacitor C6 having one end connected on a path coupling constant voltage regulator 42A and power supply circuit 40 and the other end connected to ground.

The principle of the operation of the circuit shown in FIG. 17 will be described here.

(1) When voltage is supplied from port C, the outputs of comparators IC 51 and IC 53 attain a low level irrespective of the voltage levels of ports A and B. Therefore, the output of 2-input AND circuit IC 54 is driven to a low level. Thus, voltage is always supplied from port C to constant voltage regulator 42A.

(2) When port C is open and voltage is supplied form port B, the output of comparator IC 52 attains a low level irrespective of the voltage level of port A. Therefore, the output of 2-input AND circuit IC 54 is driven to a low level, so that transistors Q54 and Q55 do not operate. The output of comparator IC 51 attains a high level, so that transistors Q52 and A53 operate. Therefore, voltage is always supplied from port B to constant voltage regulator 42A.

(3) When ports B and C are both open, the outputs of comparators IC 52 and IC 53 attain a high level, and the output of 2-input AND circuit IC 54 attains a high level. Therefore, transistors Q54 and Q55 operate if voltage is supplied from port A. Voltage is supplied from port A to constant voltage regulator 42A.

(4) When ports A–C are all open, voltage is not supplied to constant voltage regulator 42A. Each circuit in the LNB does not operate.

Thus, voltage is always supplied from a prescribed port even if there is voltage change in any of ports A–C. As a result, the current consumed at each port will not change. Therefore, the problem of a false satellite broadcasting signal being transmitted to the receiver connected to the output port caused by erroneous operation of the LNB is eliminated. Therefore, the receiver can operate stably.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A low noise block down converter comprising:
   a conversion unit receiving a plurality of types of polarized wave signals transmitted from each of a plurality of satellites to convert the plurality of polarized wave signals into a plurality of intermediate frequency signals,
   an amplify switch connected to said conversion unit to receive said plurality of intermediate frequency signals as inputs, and having a plurality of outputs connected to a plurality of output ports, respectively, determining a status according to a select signal and providing amplified said intermediate frequency signals,
   a first control unit receiving digital serial data to select a satellite from an external source via said output port, and providing said select signal according to said digital serial data,
   wherein said conversion unit comprises:
   a plurality of low noise amplifiers provided corresponding to said plurality of satellites, respectively, each low noise amplifier receiving said plurality of types of polarized wave signals to amplify low noise, a plurality of filters connected to said plurality of low noise amplifiers to remove an image signal from said plurality of types of polarized wave signals amplified in low noise, a local oscillator generating a local oscillator signal, a plurality of buffer amplifiers provided corresponding to said plurality of satellites, respectively, and connected to said local oscillator to amplify said local oscillator signal, and a plurality of mixers provided corresponding to said plurality of satellites, respectively, connected to a filter and a buffer amplifier corresponding to a satellite, mixing said local oscillator signal with said plurality of types of polarized wave signals removed in image signal to provide an intermediate frequency signal.

2. The low noise block down converter according to claim 1, wherein said filter is a trap.

3. The low noise block down converter according to claim 1, wherein said filter is a band pass filter.

4. The low noise block down converter according to claim 1, wherein said filter is a high pass filter.

5. The low noise block down converter according to claim 1, wherein said digital serial signal is serial data having two types of voltage values.

6. A low noise block down converter comprising:

a conversion unit receiving a plurality of types of polarized wave signals transmitted from each of a plurality of satellites to convert the plurality of polarized wave signals into a plurality of intermediate frequency signals, an amplify switch connected to said conversion unit to receive said plurality of intermediate frequency signals as inputs, and having a plurality of outputs connected to a plurality of output ports, respectively, determining a status according to a select signal and providing amplified said intermediate frequency signals, a first control unit receiving digital serial data to select a satellite from an external source via said output port, and providing said select signal according to said digital serial data, wherein said amplify switch comprises comprises:

an amplify unit connected to said conversion unit to amplify said plurality of intermediate frequency signals, and a switch connected to said amplify unit, receiving said amplified plurality of intermediate frequency signals as inputs, and including a plurality of outputs connected to said plurality of output ports, respectively, determining a status according to said select signal.

7. The low noise block down converter according to claim 6, wherein said switch comprises a first switch identical in number to the numbers of said plurality of satellites, provided corresponding to said plurality of satellites, respectively, each first switch circuit having a plurality of output ports, providing a polarized wave signal of the same type from the same output port according to said select signal, and a plurality of second switch circuits, each second switch circuit receiving as an input the same output port differing from the other of said first switch circuit identical in number with said plurality of satellites, and providing said input to the output according to said select signal.

8. The low noise block down converter according to claim 6, wherein said switch includes a switch having a plurality of inputs and a plurality of outputs.

9. A low noise block down converter comprising:

a conversion unit receiving a plurality of types of polarized wave signals transmitted from each of a plurality of satellites to convert the plurality of polarized wave signals into a plurality of intermediate frequency signals an amplify switch connected to said conversion unit to receive said plurality of intermediate frequency signals as inputs, and having a plurality of outputs connected to a plurality of output ports, respectively, determining a status according to a select signal and providing amplified said intermediate frequency signals, a first control unit receiving digital serial data to select a satellite from an external source via said output port, and providing said select signal according to said digital serial data, wherein said amplifier switch comprises a switch having a plurality of outputs, connected to said conversion unit to receive said plurality of intermediate frequency signals as inputs, and determining a status according to said select signal, and an amplify unit connected to said switch, and having a plurality of outputs connected to said plurality of output ports, respectively, to amplify said plurality of outputs of said switch.

10. The low noise block down converter according to claim 9, wherein said amplify unit comprises a plurality of amplifiers connected to said plurality of outputs, respectively, of said switch to amplify respective said plurality of outputs, said low noise block down converter further comprising a plurality of constant voltage regulators receiving power from an external source via said plurality of output ports to supply to said plurality of amplifiers.

11. A low noise block down converter comprising:

a conversion unit receiving a plurality of types of polarized wave signals transmitted from each of a plurality of satellites to convert the plurality of polarized wave signals into a plurality of intermediate frequency signals, an amplify switch connected to said conversion unit to receive said plurality of intermediate frequency signals as inputs, and having a plurality of outputs connected to a plurality of output ports, respectively, determining a status according to a select signal and providing amplified said intermediate frequency signals, a first control unit receiving digital serial data to select a satellite from an external source via said output port, and providing said select signal according to said digital serial data, wherein said first control unit includes a second control unit receiving digital serial data to select a satellite and a direct current having a voltage value corresponding to the type of polarized wave signal from an external source via said output port, and providing said select signal according to said digital serial data and the voltage value of said direct current.

12. The low noise block down converter according to claim 11, further comprising:

a power switch connected to said plurality of output ports to select any of said plurality of output ports according to a control signal and connecting the selected output port to the output, and a constant voltage power supply circuit connected to said power switch, receiving said direct current output from said power switch to supply power subjected to conversion to a constant voltage to said conversion unit and said second control unit, wherein said second control unit comprises
- a select signal output unit providing said select signal according to said digital serial data and the voltage value of said direct current, and
- a control signal output unit providing said control signal according to said digital serial data and the voltage value of said direct current.

13. The low noise block down converter according to claim 12, wherein said power switch is connected to said plurality of output ports to select an output port determined according to a predetermined priority and connecting the selected output port to the output.

14. The low noise block down converter according to claim 12, wherein said power switch comprises {n (n−1)/2} comparators when the number of said output ports is n.

15. A satellite broadcast reception system comprising:
- a conversion unit receiving a plurality of types of polarized wave signals transmitted from each of a plurality of satellites to convert the plurality of polarized wave signals into a plurality of intermediate frequency signals,
- an amplify switch connected to said conversion unit to receive said plurality of intermediate frequency signals as inputs, and having a plurality of outputs connected to a plurality of output ports, respectively, determining a status according to a select signal and providing amplified said intermediate frequency signals,
- a low noise block down converter receiving digital serial data to select a satellite from an external source via said output port to output said select signal according to said digital serial data, and
- a satellite broadcast receiver connected to said low noise block down converter for usage;

wherein said conversion unit comprises:
- a plurality of low noise amplifiers provided corresponding to said plurality of satellites, respectively, each low noise amplifier receiving said plurality of polarized wave signals to amplify low noise,
- a plurality of filters connected to said plurality of low noise amplifiers to remove an image signal from said plurality of types of polarized wave signals amplified in low noise,
- a local oscillator generating a local oscillator signal,
- a plurality of buffer amplifiers provided corresponding to said plurality of satellites, respectively, and connected to said local oscillator to amplify said local oscillator signals respectively, and
- a plurality of mixers provided corresponding to said plurality of satellites, respectively, connected to a filter and a buffer amplifier corresponding to a satellite, mixing said local oscillator signal with said plurality of types of polarized wave signals removed in image signal to output an intermediate frequency signal.

16. The satellite broadcast reception system according to claim 15, wherein said filter is a trap.

17. The satellite broadcast reception system according to claim 15, wherein said filter is a band pass filter.

18. The satellite broadcast reception system according to claim 15, wherein said filter is a high pass filter.

19. The satellite broadcast reception system according to claim 15, wherein said digital serial signal is serial data having two types of voltage values.

20. The satellite broadcast reception system according to claim 15, wherein said satellite broadcast receiver comprises
- an intermediate frequency signal conversion unit extracting and providing a video signal and an audio signal from an intermediate frequency signal based on a wave from a satellite input to said input port,
- an input unit to input a select signal to select a satellite, and
- a digital serial data supply unit connected to said input unit to supply digital serial data to select a satellite to said input port according to said select signal.

21. A satellite broadcast reception system comprising:
- a conversion unit receiving a plurality of types of polarized wave signals transmitted from each of a plurality of satellites to convert the plurality of polarized wave signals into a plurality of intermediate frequency signals,
- an amplify switch connected to said conversion unit to receive said plurality of intermediate frequency signals as inputs, and having a plurality of outputs connected to a plurality of output ports, respectively, determining a status according to a select signal and providing amplified said intermediate frequency signals,
- a low noise block down converter receiving digital serial data to select a satellite from an external source via said output port to output said select signal according to said digital serial data, and
- a satellite broadcast receiver connected to said low noise block down converter for usage;

wherein said amplify switch comprises:
- an amplify unit connected to said conversion unit to amplify said plurality of intermediate frequency signals, and
- a switch connected to said amplify unit, receiving said plurality of intermediate frequency signals amplified as inputs, having a plurality of outputs connected to said plurality of output ports, respectively, determining a status according to said select signal.

22. The satellite broadcast reception system according to claim 21, wherein said switch comprises
- a first switch circuit identical in number to the numbers of said plurality of satellites, provided corresponding to said plurality of satellites, each first switch circuit having a plurality of output ports, providing a polarized wave signal of the same type from the same output port according to said select signal, and
- a plurality of second switch circuits, each receiving as an input the same output port respectively differing from the other of said first switch circuits identical in number with said plurality of satellites to provide said input to the output according to said select signal.

23. The satellite broadcast reception system according to claim 21, wherein said switch includes a switch having a plurality of inputs and a plurality of outputs.

24. A satellite broadcast reception system comprising:
- a conversion unit receiving a plurality of types of polarized wave signals transmitted from each of a plurality of satellites to convert the plurality of polarized wave signals into a plurality of intermediate frequency signals,
- an amplify switch connected to said conversion unit to receive said plurality of intermediate frequency signals as inputs, and having a plurality of outputs connected to a plurality of output ports, respectively, determining a status according to a select signal and providing amplified said intermediate frequency signals, a low noise block down converter receiving digital serial data to select a satellite from an external source via said output port to output said select signal according to said digital serial data, and a satellite broadcast receiver connected to said low noise block down converter for usage;

wherein said amplify switch comprises a switch connected to said conversion unit, and having a plurality of outputs, receiving said plurality of intermediate frequency signals as inputs, and determining a status according to said select signal, and an amplify unit connected to said switch, and having a plurality of outputs connected to said plurality of output ports, respectively, to amplify respective said plurality of outputs of said switch.

25. The satellite broadcast reception system according to claim 24, wherein said amplify unit includes a plurality of amplifiers connected to said plurality of outputs, respectively of said switch to amplify respective said plurality of outputs, said satellite broadcast reception system further comprising a plurality of constant voltage regulators receiving power from an external source via said plurality of output ports to supply to said plurality of amplifiers.

26. A satellite broadcast reception system comprising:

a conversion unit receiving a plurality of types of polarized wave signals transmitted from each of a plurality of satellites to convert the plurality of polarized wave signals into a plurality of intermediate frequency signals, an amplify switch connected to said conversion unit to receive said plurality of intermediate frequency signals as inputs, and having a plurality of outputs connected to a plurality of output ports, respectively, determining a status according to a select signal and providing amplified said intermediate frequency signals, a low noise block down converter receiving digital serial data to select a satellite from an external source via said output port to output said select signal according to said digital serial data, and a satellite broadcast receiver connected to said low noise block down converter for usage, a first control unit receiving digital serial data to select a satellite from an external source via said output ports, and providing said select signal according to said digital serial data, wherein said first control unit includes a second control unit receiving digital serial data to select a satellite and a direct current having a voltage value corresponding to the type of polarized wave signal from an external source through said output port, and providing said select signal according to said digital serial data and the voltage value of said direct current.

27. The satellite broadcast reception system according to claim 26, wherein said low noise block down converter comprises a power switch connected to said plurality of output ports to select any of the output ports according to a control signal and connecting the selected output port to its output, and a constant value power supply circuit connected to said power switch to receive said current output by said power switch to supply power subjected to conversion into constant voltage to said conversion unit and said second control unit, wherein said second control unit comprises a select signal output unit providing said select signal according to said digital serial data and the voltage value of said direct current, and a control signal output unit providing said control signal according to said digital serial data and the voltage value of said direct current.

28. The satellite broadcast reception system according to claim 27, wherein said power switch is connected to said plurality of output ports to select an output port determined according to a predetermined priority and connecting the selected output port to its output.

29. The satellite broadcast reception system according to claim 27, wherein said power switch comprises $\{n(n-1)/2\}$ comparators when the number of said output ports is n.

30. A satellite broadcast reception system comprising:

a conversion unit receiving a plurality of types of polarized wave signals transmitted from each of a plurality of satellites to convert the plurality of polarized wave signals into a plurality of intermediate frequency signals, an amplify switch connected to said conversion unit to receive said plurality of intermediate frequency signals as inputs, and having a plurality of outputs connected to a plurality of output ports, respectively, determining a status according to a select signal and providing amplified said intermediate frequency signals, a low noise block down converter receiving digital serial data to select a satellite from an external source via said output port to output said select signal according to said digital serial data, and a satellite broadcast receiver connected to said low noise block down converter for usage;

wherein said satellite broadcast receiver comprises:

an intermediate frequency signal conversion unit extracting and providing a video signal and an audio signal from an intermediate frequency signal based on a wave from a satellite input to said input port, an input unit to input a select signal to select a satellite, and a digital serial data supply unit connected to said input unit to supply digital serial data to select a satellite to said input port according to said select signal;

wherein said intermediate frequency signal conversion unit comprises:

a video•audio signal extraction unit extracting and providing a video signal and an audio signal from said intermediate frequency signal, a reception signal information output unit providing reception signal information representing a reception status of a satellite by said intermediate frequency signal, said satellite broadcast receiver further comprising a status signal output unit connected to said input and said reception signal information output unit to output said select signal and said reception signal information.

* * * * *